United States Patent
Colombeau et al.

(10) Patent No.: US 10,861,722 B2
(45) Date of Patent: Dec. 8, 2020

(54) INTEGRATED SEMICONDUCTOR PROCESSING

(71) Applicant: Applied Materials, Inc., Santa Clara, CA (US)

(72) Inventors: Benjamin Colombeau, Salem, MA (US); Sheng-Chin Kung, Milpitas, CA (US); Patricia M. Liu, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/579,756

(22) Filed: Sep. 23, 2019

(65) Prior Publication Data

US 2020/0152493 A1    May 14, 2020

Related U.S. Application Data

(60) Provisional application No. 62/760,553, filed on Nov. 13, 2018.

(51) Int. Cl.
*H01L 21/67* (2006.01)
*H01L 21/3065* (2006.01)
(Continued)

(52) U.S. Cl.
CPC .. *H01L 21/67167* (2013.01); *H01L 21/02057* (2013.01); *H01L 21/02532* (2013.01);
(Continued)

(58) Field of Classification Search
CPC ........... H01L 21/67167; H01L 21/3065; H01L 21/02532; H01L 21/02057; H01L 29/165; H01L 29/401; H01L 21/67069; H01L 21/67196; H01L 29/66545; H01L 21/67207; H01L 29/42392; H01L 21/67201; H01L 21/67028; H01L 29/66795

See application file for complete search history.

(56) References Cited

U.S. PATENT DOCUMENTS 5,134,090 A * 7/1992 Bean ................. H01L 21/76294
117/105
5,780,313 A * 7/1998 Yamazaki ............. C23C 16/511
118/719

(Continued)

*Primary Examiner* — John P. Dulka
(74) *Attorney, Agent, or Firm* — Patterson + Sheridan, LLP

(57) ABSTRACT

Generally, examples described herein relate to integrated solutions for forming cladding layers on trimmed layers that were formed as part of a superlattice. In an example, a first material is selectively etched in a first processing chamber of a processing system. The first material is disposed within alternating layers of the first material and a second material in a channel region on a substrate. A portion of the second material is trimmed in the first processing chamber of the processing system. The substrate is transferred from the first processing chamber of the processing system to a second processing chamber of the processing system without exposing the substrate to an ambient environment exterior to the processing system. A cladding layer is epitaxially grown on respective layers of the trimmed second material in the second processing chamber of the processing system.

20 Claims, 14 Drawing Sheets

(51) Int. Cl.
*H01L 21/02* (2006.01)
*H01L 29/165* (2006.01)
*H01L 29/40* (2006.01)
*H01L 29/66* (2006.01)
*H01L 29/423* (2006.01)

(52) U.S. Cl.
CPC .... *H01L 21/3065* (2013.01); *H01L 21/67028* (2013.01); *H01L 21/67069* (2013.01); *H01L 21/67196* (2013.01); *H01L 21/67201* (2013.01); *H01L 21/67207* (2013.01); *H01L 29/165* (2013.01); *H01L 29/401* (2013.01); *H01L 29/42392* (2013.01); *H01L 29/66545* (2013.01); *H01L 29/66795* (2013.01)

(56) References Cited

U.S. PATENT DOCUMENTS

| | | | |
|---|---|---|---|
| 10,748,901 B2* | 8/2020 | Rubin | H01L 29/7851 |
| 2002/0110945 A1* | 8/2002 | Kuramata | H01L 21/02458 |
| | | | 438/36 |
| 2002/0160553 A1* | 10/2002 | Yamanaka | H01L 29/66772 |
| | | | 438/149 |
| 2004/0241991 A1* | 12/2004 | Aoyama | H01L 21/67167 |
| | | | 438/689 |
| 2006/0016458 A1* | 1/2006 | Novak | H01L 21/67028 |
| | | | 134/1 |
| 2007/0163498 A1* | 7/2007 | Clark | H01J 37/3244 |
| | | | 118/715 |
| 2008/0102646 A1* | 5/2008 | Kawaguchi | H01L 21/02057 |
| | | | 438/725 |
| 2008/0135949 A1* | 6/2008 | Lo | B82Y 10/00 |
| | | | 257/401 |
| 2009/0047759 A1* | 2/2009 | Yamazaki | H01L 29/4908 |
| | | | 438/158 |
| 2009/0047774 A1* | 2/2009 | Yamazaki | H01L 21/02532 |
| | | | 438/479 |
| 2009/0140259 A1* | 6/2009 | Yamazaki | H01L 29/78696 |
| | | | 257/67 |
| 2011/0097902 A1* | 4/2011 | Singh | H01L 21/67115 |
| | | | 438/710 |
| 2011/0175140 A1* | 7/2011 | Taylor | H01J 37/32357 |
| | | | 257/190 |
| 2011/0263133 A1* | 10/2011 | Hara | H01L 21/6838 |
| | | | 438/758 |
| 2012/0235249 A1* | 9/2012 | Kronholz | H01L 21/76283 |
| | | | 257/402 |
| 2013/0273709 A1* | 10/2013 | Jakubowski | H01L 21/76232 |
| | | | 438/400 |
| 2014/0262038 A1* | 9/2014 | Wang | H01L 21/3105 |
| | | | 156/345.35 |
| 2015/0162419 A1* | 6/2015 | Li | H01L 21/02074 |
| | | | 438/585 |
| 2015/0187609 A1* | 7/2015 | Wen | H01L 21/6719 |
| | | | 134/113 |
| 2018/0230624 A1* | 8/2018 | Dube | H01J 37/32357 |
| 2018/0261464 A1* | 9/2018 | Kobayashi | H01L 29/66795 |
| 2019/0062904 A1* | 2/2019 | Hawrylchak | H01L 21/02661 |
| 2020/0126987 A1* | 4/2020 | Rubin | H01L 29/0673 |
| 2020/0161171 A1* | 5/2020 | Colombeau | H01L 21/02057 |
| 2020/0161188 A1* | 5/2020 | Liao | H01L 21/823864 |
| 2020/0185508 A1* | 6/2020 | MacElwee | H01L 21/308 |

* cited by examiner

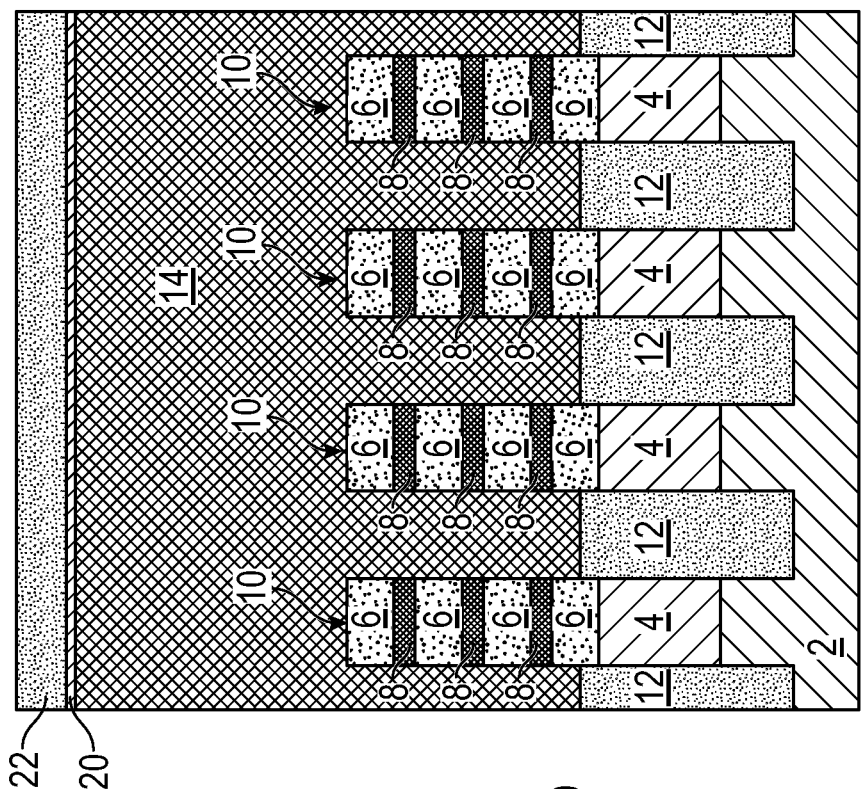
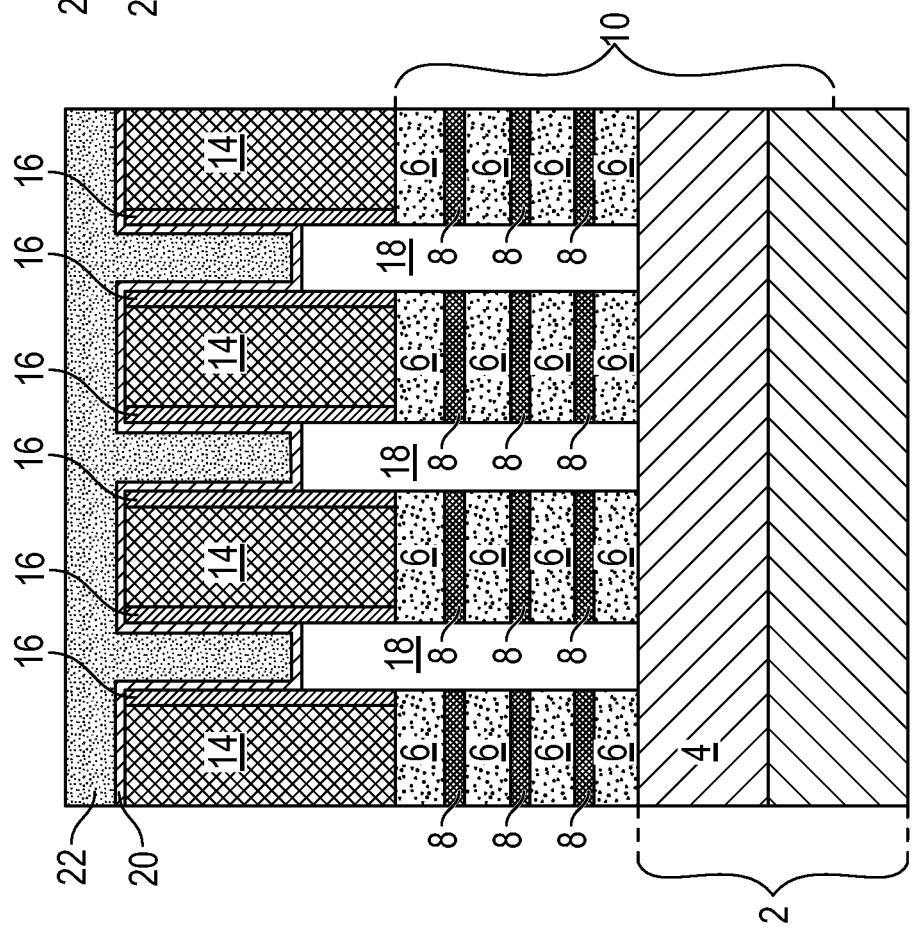
FIG. 8A
FIG. 8B

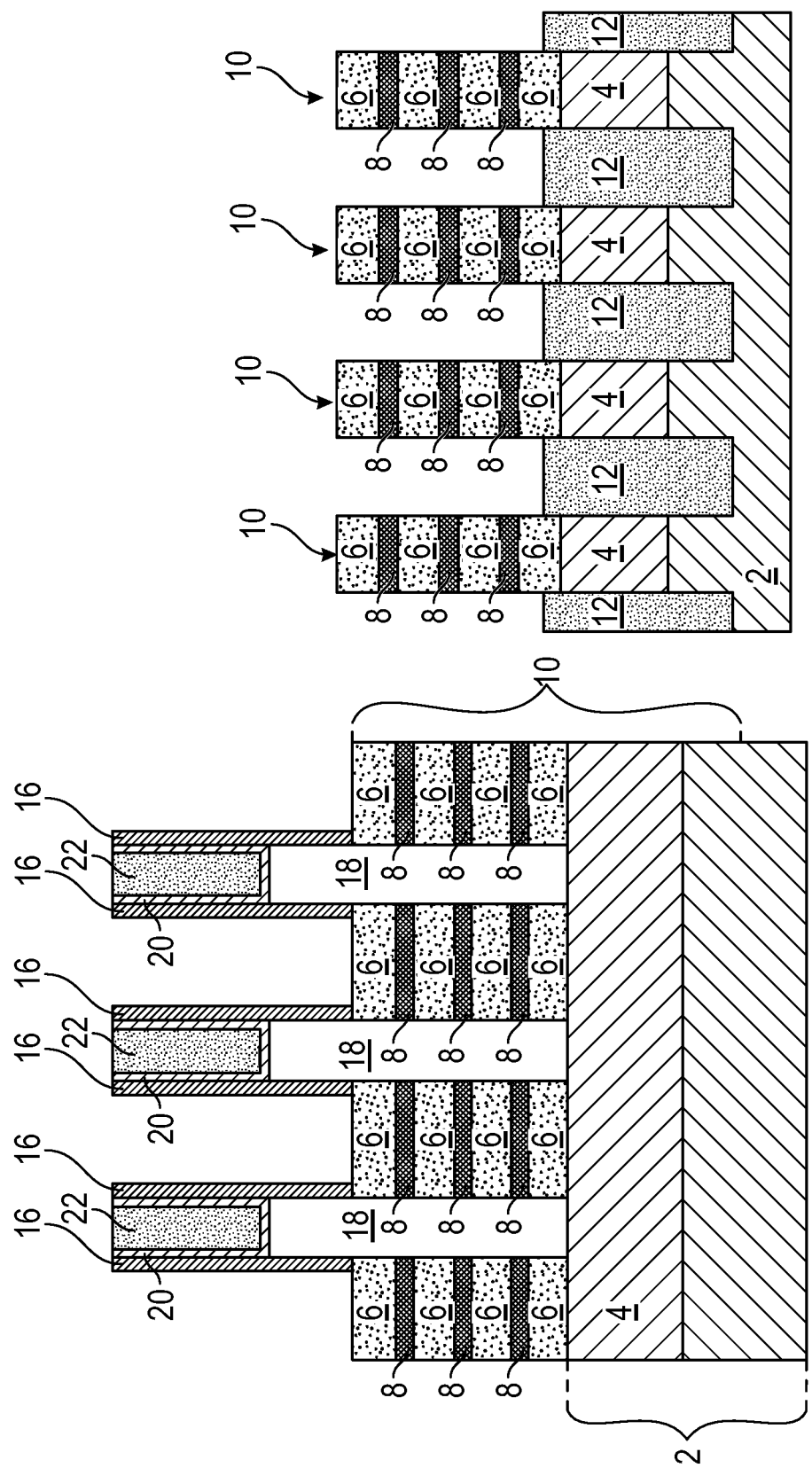

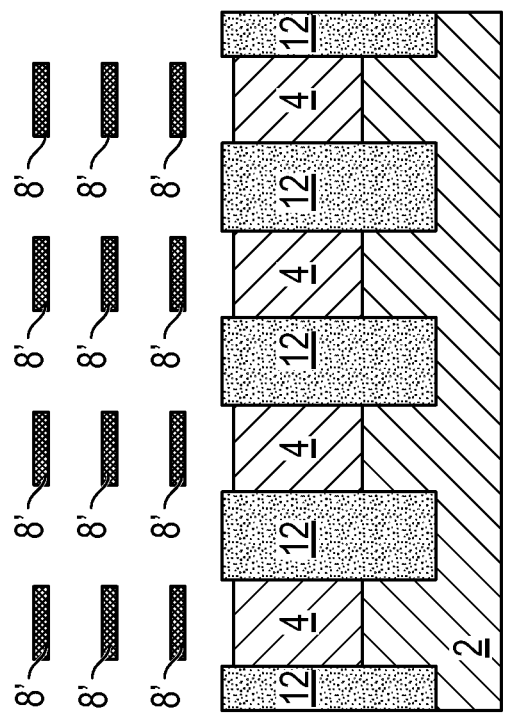
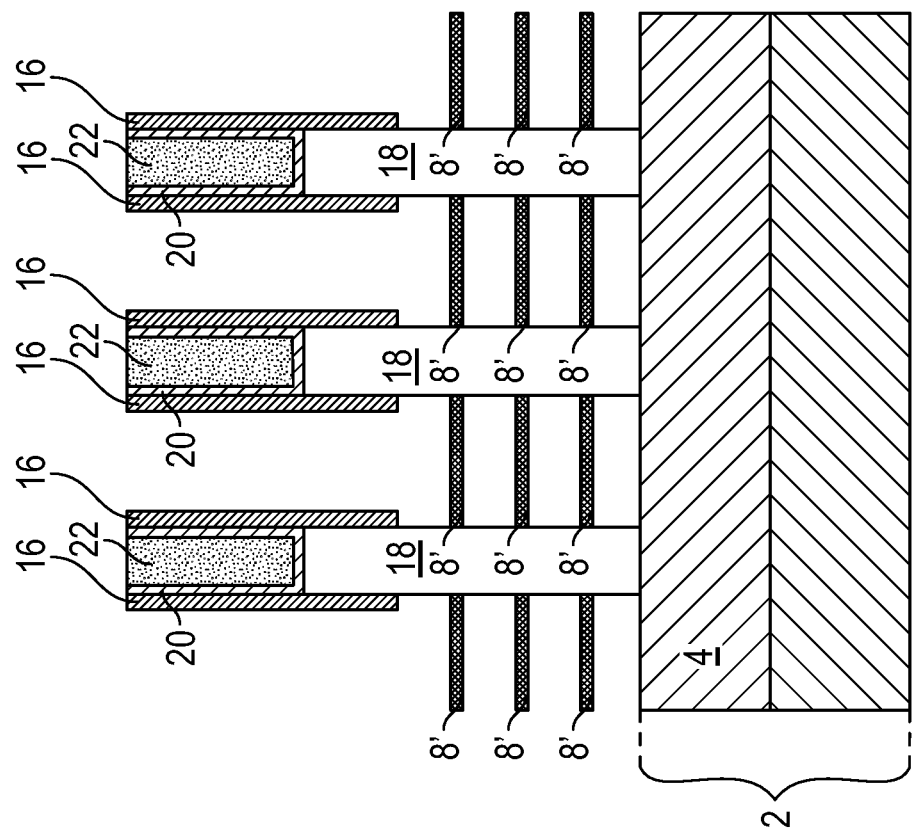
FIG. 11B
FIG. 11A

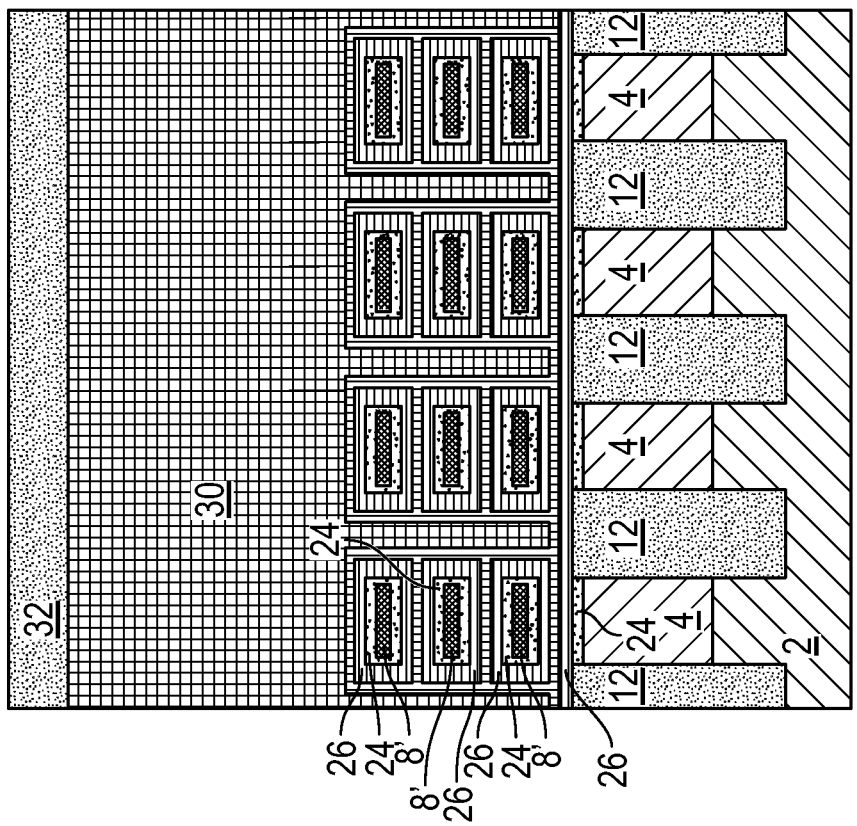
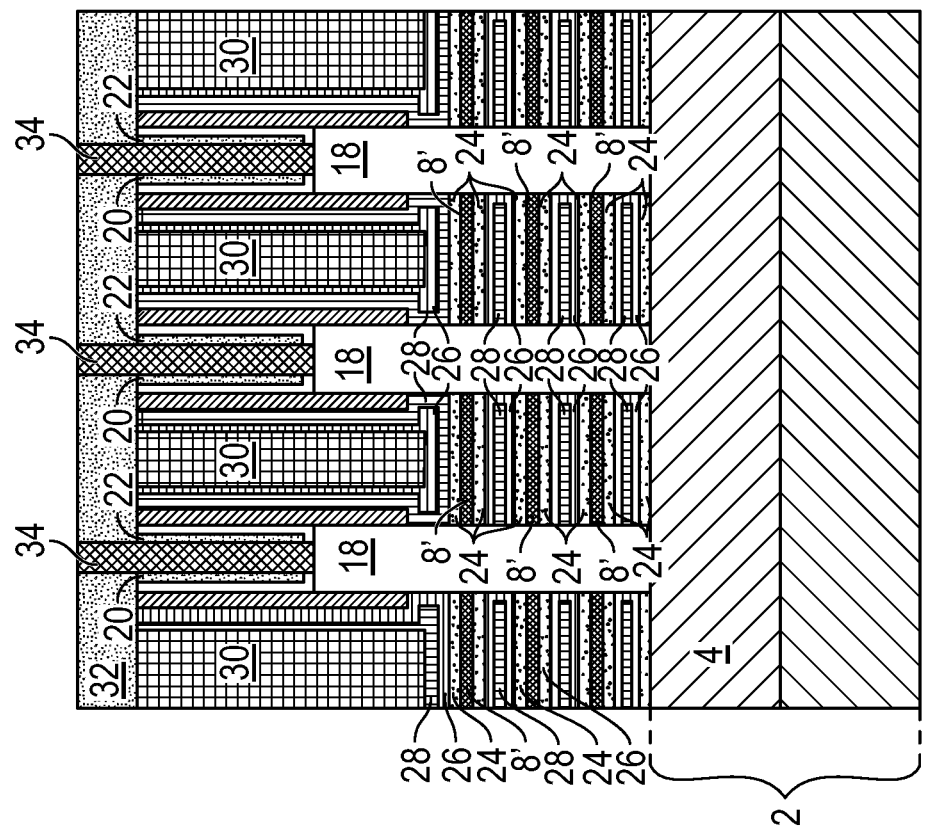
FIG. 13B
FIG. 13A

INTEGRATED SEMICONDUCTOR PROCESSING

CROSS-REFERENCE TO RELATED APPLICATIONS

This application claims priority to and the benefit of U.S. Provisional Patent Application Ser. No. 62/760,553, filed on Nov. 13, 2018, and entitled "Integrated Semiconductor Processing," which is incorporated herein by reference in its entirety.

BACKGROUND

Field

Examples described herein generally relate to the field of semiconductor processing, and more specifically, to integrated semiconductor processing solutions.

Description of the Related Art

Reliably producing nanometer and smaller features is one of the key technology challenges for next generation very large scale integration (VLSI) and ultra large-scale integration (ULSI) of semiconductor devices. As the limits of circuit technology are pushed, the shrinking dimensions of VLSI and ULSI technology have placed additional demands on processing capabilities. As the dimensions of the integrated circuit components are reduced (e.g., in nanometer dimensions), the materials and processes used to fabricate components are generally carefully selected in order to obtain satisfactory levels of electrical performance.

Due to the complexity of VLSI and ULSI structures today, substrates on which these devices are formed must be processed in multiple different processing chambers that are configured to typically perform at least one of a patterning step, a deposition step, an etching step, or a thermal processing step. Due to incompatibility between process chemistries, difference in chamber throughput, or processing technology, it is common in the semiconductor fabrication industry for equipment manufacturers to position only certain types of processing technology (e.g., deposition chambers) in one processing system and another processing technology (e.g., etching chambers) in another processing system. The division of the processing technologies, found in conventional semiconductor equipment, requires the substrates to be transferred from one processing system to another so that the various different semiconductor manufacturing processes can be performed on a substrate. The transferring process performed between the various processing systems exposes the substrates to various forms of contamination and particles.

Therefore, there is need for a process and processing equipment that is able to form complex devices and that avoids the common contamination and particle sources that effect semiconductor processing today.

SUMMARY

Embodiments of the disclosure include a method for semiconductor processing. A first material is selectively etched in a first processing chamber of a processing system. The first material is disposed within alternating layers of the first material and a second material in a channel region on a substrate. A portion of the second material is trimmed in the first processing chamber of the processing system. The substrate is transferred from the first processing chamber of the processing system to a second processing chamber of the processing system without exposing the substrate to an ambient environment exterior to the processing system. A cladding layer is epitaxially grown on respective layers of the trimmed second material in the second processing chamber of the processing system.

Embodiments of the disclosure also include a semiconductor processing system. The semiconductor processing system includes a transfer apparatus, a first processing chamber coupled to the transfer apparatus, a second processing chamber coupled to the transfer apparatus, and a system controller. The system controller is configured to control a selective etch process performed in the first processing chamber. The selective etch process selectively removes a first material in alternating layers of the first material and a second material disposed within a channel region on a substrate. The system controller is configured to control a trimming process performed in the first processing chamber. The trimming process trims a portion of the second material. The system controller is configured to control a transfer of the substrate from the first processing chamber to the second processing chamber through the transfer apparatus. The system controller is configured to control an epitaxial growth process performed in the second processing chamber. The epitaxial growth process deposits a cladding layer on respective layers of the trimmed second material.

Embodiments of the disclosure further include a semiconductor processing system that includes a non-transitory computer-readable medium storing instructions that, when executed by a processor, cause a computer system to perform operations. The operations include controlling a selective etch process in a first processing chamber of a processing system. The selective etch process selectively removes a first material in alternating layers of the first material and a second material disposed within a channel region on a substrate. The operations include controlling a trimming process in the first processing chamber. The trimming process trims a portion of the second material. The operations include controlling a transfer of the substrate from the first processing chamber to a second processing chamber of the processing system through a transfer apparatus of the processing system. The first processing chamber and the second processing chamber are coupled to the transfer apparatus. The operations include controlling an epitaxial growth process in the second processing chamber. The epitaxial growth process deposits a cladding layer on respective layers of the trimmed second material.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

FIGS. 6, 7A, 7B, 8A, 8B, 9A, 9B, 10A, 10B, 11A, 11B, 12A, 12B, 13A, and 13B are various views of intermediate semiconductor structures illustrating aspects of the method of FIG. 5 according to some examples of the present disclosure.

To facilitate understanding, identical reference numerals have been used, wherever possible, to designate identical elements that are common to the figures.

DETAILED DESCRIPTION

Figure 1:
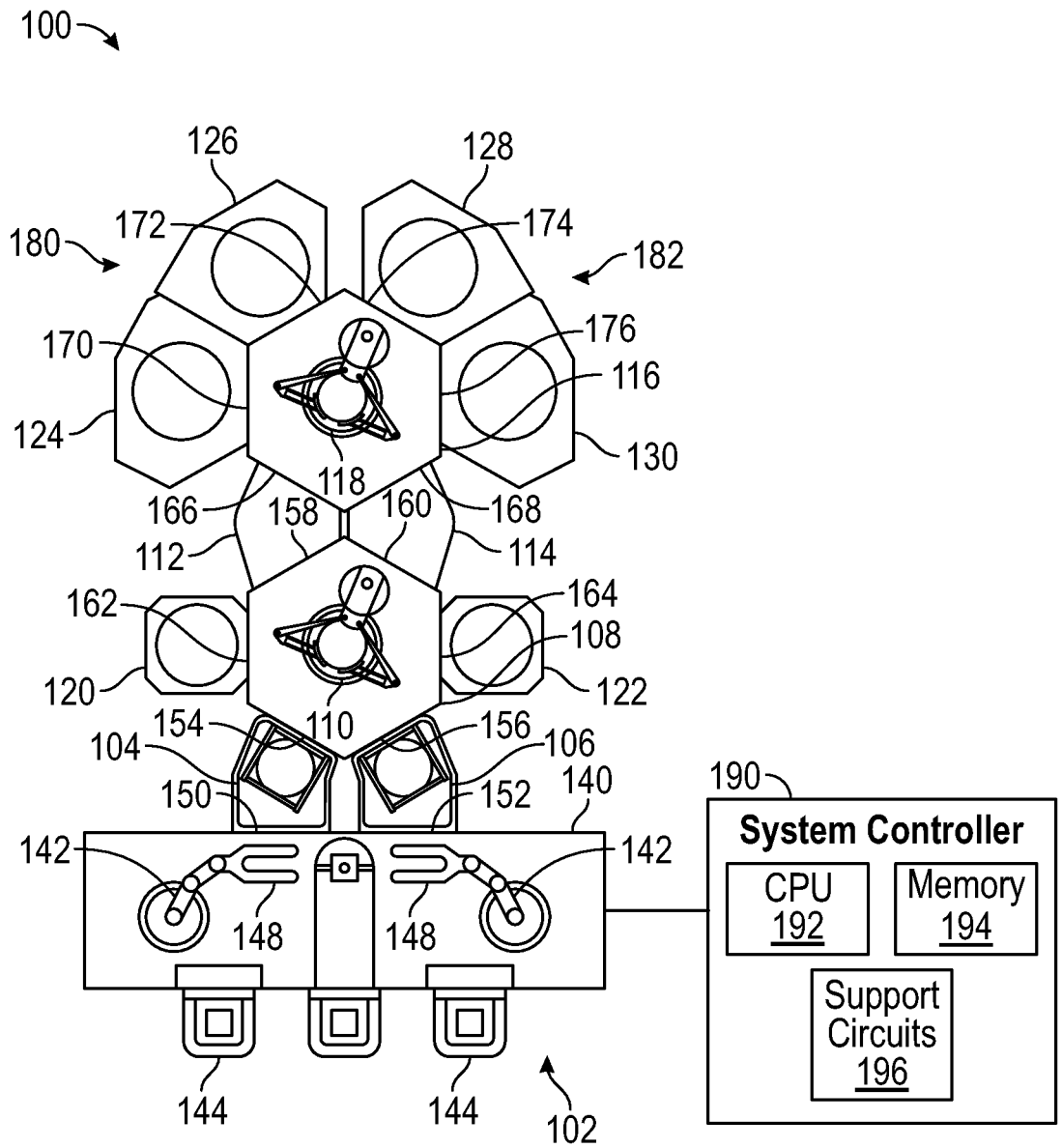
FIG. 1 is a schematic top-view diagram of an example multi-chamber processing system according to some examples of the present disclosure.

Generally, examples described herein relate to methods and semiconductor processing systems for forming cladding layers on trimmed layers that were formed as part of a superlattice. The structures formed by such processing can be implemented in, for example, horizontal gate all around field effect transistors (hGAA FETs). The methods and semiconductor processing systems can provide an integrated solution to trim the layers to be trimmed and thereafter epitaxially grow cladding layers on the trimmed layers.

In semiconductor processing, dimensions of devices, such as FETs, continue to decrease. Any loss or variation of dimensions can have an increased impact as the dimensions decrease. Loss and variation of dimensions can occur as a result of cleaning processes that may be performed on semiconductor structures. For example, a cleaning process may be performed after a substrate on which the structure is formed is transported between different processing systems (e.g., in a front opening unified pod (FOUP)) in an atmospheric ambient environment (e.g., an environment in a fabrication facility (a "fab")). During such transport, an oxide can be formed on the structure as a result of exposure to the atmospheric ambient environment, and the cleaning process can be performed to remove the formed oxide. Removal of the oxide can, however, result in loss and variation of some dimensions of the structure on the substrate.

Some examples provided herein provide a processing system where a substrate can be transferred from a first processing chamber that trims layers to a second processing chamber that epitaxially grows cladding layers without exposing the substrate to an atmospheric ambient environment. For example, the substrate can be transferred in a transfer apparatus (comprising one or more transfer chambers) that maintains a low pressure or vacuum environment in which the substrate is transferred. By providing such an integrated solution, exposure of the substrate to an atmospheric ambient environment can be avoided, which can further obviate the need for cleaning processes from being performed between the trimming process performed in the first processing chamber and the epitaxial growth process performed in the second processing chamber. Obviating such cleaning can reduce overall processing and can reduce a Q-Time. Additionally, FETs (e.g., hGAA FETs) formed with the cladding layers as a channel region according to such processing can have an improved threshold voltage, an improved drive current, and an improved reliability.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

FIG. 1 is a schematic top-view diagram of an example of a multi-chamber processing system 100 according to some examples of the present disclosure. The processing system 100 generally includes a factory interface 102, load lock chambers 104, 106, transfer chambers 108, 116 with respective transfer robots 110, 118, holding chambers 112, 114, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers in a low pressure (e.g., less than or equal to about 300 Torr) or vacuum environment without breaking the low pressure or vacuum environment between various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, Calif. It is contemplated that other processing systems (including those from other manufacturers) may be adapted to benefit from aspects described herein.

In the illustrated example of FIG. 1, the factory interface 102 includes a docking station 140 and factory interface robots 142 to facilitate transfer of substrates. The docking station 140 is configured to accept one or more front opening unified pods (FOUPs) 144. In some examples, each factory interface robot 142 generally comprises a blade 148 disposed on one end of the respective factory interface robot 142 configured to transfer the substrates from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 112, 114 and respective ports 162, 164 coupled to processing chambers 120, 122. Similarly, the transfer chamber 116 has respective ports 166, 168 coupled to the holding chambers 112, 114 and respective ports 170, 172, 174, 176 coupled to processing chambers 124, 126, 128, 130. The ports 154, 156, 158, 160, 162, 164, 166, 168, 170, 172, 174, 176 can be, for example, slit valve openings with slit valves for passing substrates therethrough by the transfer robots 110, 118 and for providing a seal between respective chambers to prevent a gas from passing between the respective chambers. Generally, any port is open for transferring a substrate therethrough; otherwise, the port is closed.

The load lock chambers 104, 106, transfer chambers 108, 116, holding chambers 112, 114, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps, etc.), gas sources, various valves, and conduits fluidly coupled to the various chambers. In operation, a factory interface robot 142 transfers a substrate from a FOUP 144 through a port 150 or 152 to a load lock chamber 104 or 106. The gas and pressure control system then pumps down the load lock chamber 104 or 106. The gas and pressure control system further maintains the transfer chambers 108, 116 and holding chambers 112, 114 with an interior low pressure or vacuum environment (which may include an inert gas). Hence, the pumping down of the load lock chamber 104 or 106 facilitates passing the substrate between e.g., the atmospheric environment of the factory interface 102 and the low pressure or vacuum environment of the transfer chamber 108.

With the substrate in the load lock chamber 104 or 106 that has been pumped down, the transfer robot 110 transfers the substrate from the load lock chamber 104 or 106 into the transfer chamber 108 through the port 154 or 156. The transfer robot 110 is then capable of transferring the substrate to and/or between any of the processing chambers 120, 122 through the respective ports 162, 164 for processing and the holding chambers 112, 114 through the respective ports 158, 160 for holding to await further transfer. Similarly, the transfer robot 118 is capable of accessing the substrate in the holding chamber 112 or 114 through the port 166 or 168 and is capable of transferring the substrate to and/or between any of the processing chambers 124, 126, 128, 130 through the respective ports 170, 172, 174, 176 for processing and the holding chambers 112, 114 through the respective ports 166, 168 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 122 can be capable of performing a cleaning process; the processing chamber 120 can be capable of performing an etch process; and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif.

A system controller 190 is coupled to the processing system 100 for controlling the processing system 100 or components thereof. For example, the system controller 190 may control the operation of the processing system 100 using a direct control of the chambers 104, 106, 108, 112, 114, 116, 120, 122, 124, 126, 128, 130 of the processing system 100 or by controlling controllers associated with the chambers 104, 106, 108, 112, 114, 116, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, e.g., a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 116 and the holding chambers 112, 114. In other examples, more or fewer transfer chambers (e.g., one transfer chamber) and/or more or fewer holding chambers (e.g., no holding chambers) may be implemented as a transfer apparatus in a processing system.

Figure 2:
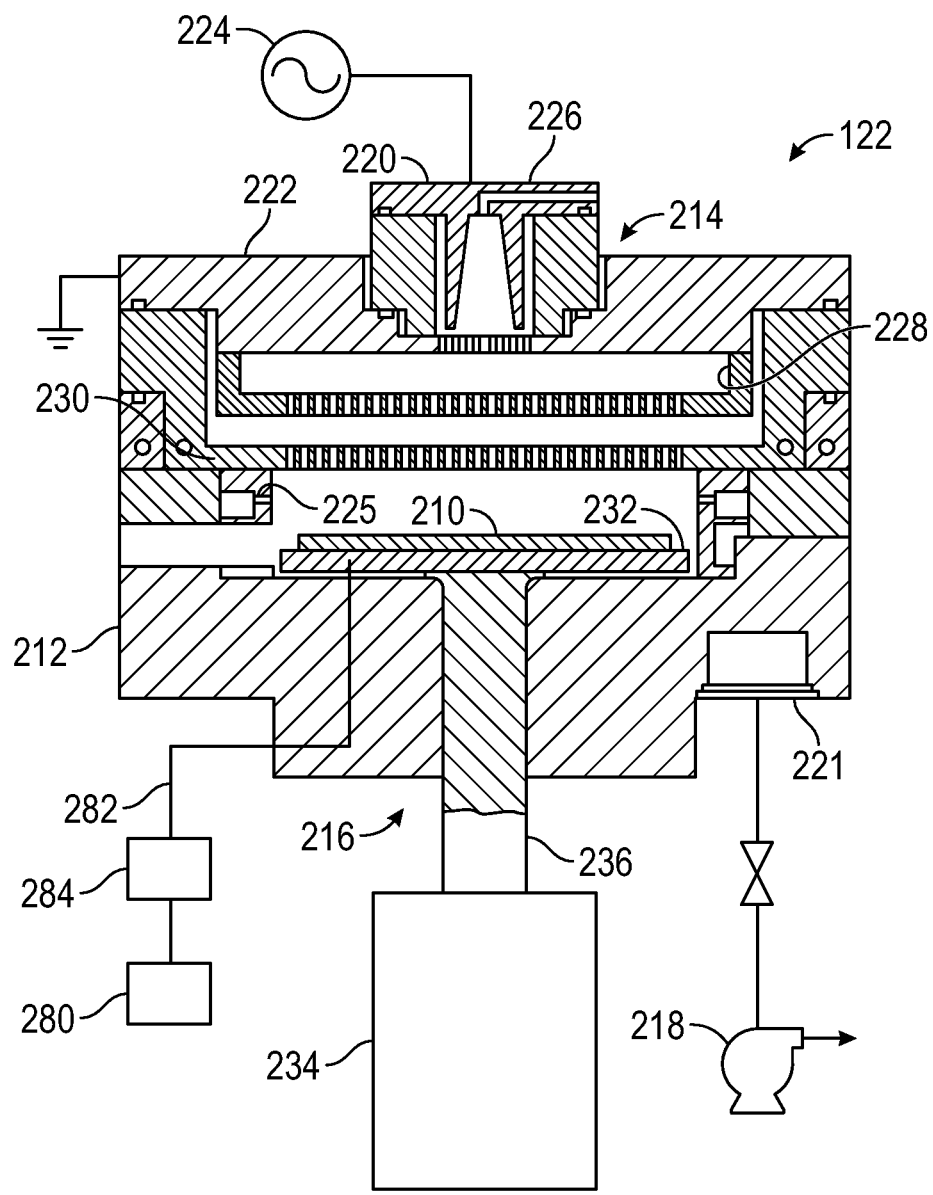
FIG. 2 is a cross-sectional view of a processing chamber that may be used to perform a cleaning process according to some examples of the present disclosure.

FIG. 2 is a cross-sectional view of a processing chamber 122 that may be used to perform a cleaning process. The processing chamber 122 may be a SiCoNi® Preclean chamber available from Applied Materials of Santa Clara, Calif. The processing chamber 122 includes a chamber body 212, a lid assembly 214, and a support assembly 216. The lid assembly 214 is disposed at an upper end of the chamber body 212, and the support assembly 216 is at least partially disposed within the chamber body 212. The chamber body 212, lid assembly 214, and support assembly 216 together define a region in which a substrate may be processed.

The lid assembly 214 includes at least two stacked components configured to form a plasma region therebetween. A first electrode 220 is disposed vertically above a second electrode 222 confining a plasma volume therebetween. The first electrode 220 is connected to a radio frequency (RF) power source 224, and the second electrode 222 is connected to ground, which forms a capacitance between the first electrode 220 and the second electrode 222.

The lid assembly 214 also includes one or more gas inlets 226 for providing a cleaning gas to a substrate surface through a blocker plate 228 and a gas distribution plate 230, such as a showerhead. The cleaning gas may be an etchant, ionized gas or active radical, such as ionized fluorine, chlorine, or ammonia. In other examples, a different cleaning process may be utilized to clean the substrate surface. For example, a remote plasma containing He and $NF_3$ may be introduced into the processing chamber 122 through the gas distribution plate 230, while $NH_3$ may be directly injected into the processing chamber 122 via a separate gas inlet 225 that is disposed at a side of the chamber body 212.

The support assembly 216 may include a substrate support 232 to support a substrate 210 thereon during processing. The substrate support 232 has a flat substrate supporting surface for supporting the substrate to be processed thereon. The substrate support 232 may be coupled to an actuator 234 by a shaft 236 which extends through a centrally-located opening formed in a bottom of the chamber body 212. The actuator 234 may be flexibly sealed to the chamber body 212 by bellows (not shown) that prevent vacuum leakage from around the shaft 236. The actuator 234 allows the substrate support 232 to be moved vertically within the chamber body 212 between a process position and a lower, transfer position. The transfer position is slightly below the opening of a slit valve opening formed in a sidewall of the chamber body 212. In operation, the substrate support 232 may be elevated to a position in close proximity to the lid assembly 214 to control the temperature of the substrate 210 being processed.

As such, the substrate 210 may be heated via radiation emitted or convection from the gas distribution plate 230.

A bias RF power supply 280 may be coupled to the substrate support 232 through a matching network 284. The bias RF power supply 280 provides a bias to the substrate 210 to direct the ionized cleaning gas toward the substrate 210.

A vacuum system, which may be part of the gas and pressure control system of the processing system 100, can be used to remove gases from the processing chamber 122. The vacuum system includes a vacuum pump 218 coupled to a vacuum port 221 disposed in the chamber body 212. The processing chamber 122 also includes a controller (not shown), which may be the system controller 190 or a controller controlled by the system controller 190, for controlling processes within the processing chamber 122.

Figure 3:
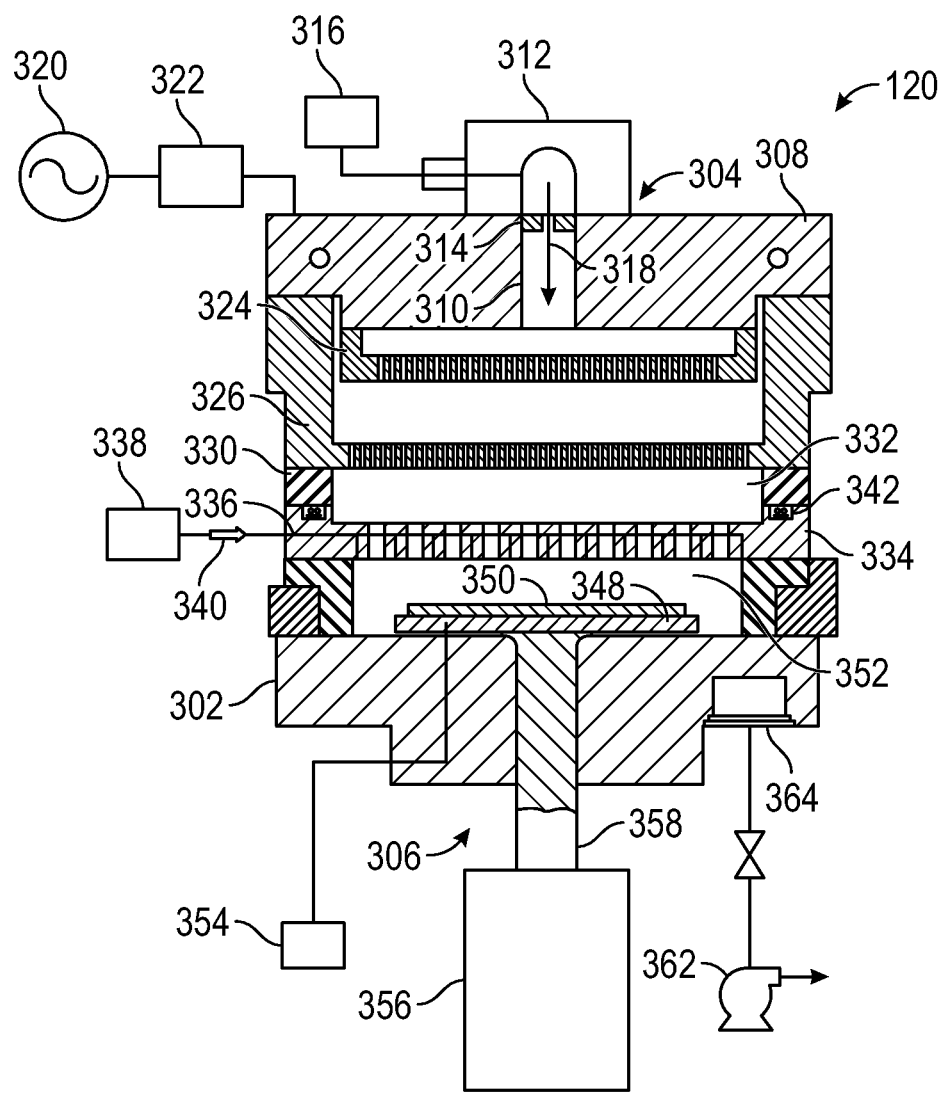
FIG. 3 is a cross-sectional view of a processing chamber that may be used to perform a selective etch process and trimming process according to some examples of the present disclosure.

FIG. 3 is a cross-sectional view of a processing chamber 120 that may be used to perform a selective etch process and trimming process. The processing chamber 120 may be a Selectra® Etch chamber available from Applied Materials of Santa Clara, Calif. The processing chamber 120 includes a chamber body 302, a lid assembly 304, and a support assembly 306. The lid assembly 304 is disposed at an upper end of the chamber body 302, and the support assembly 306 is at least partially disposed within the chamber body 302. The chamber body 302, lid assembly 304, and support assembly 306 together define a region in which a substrate may be processed. As apparent from the following description, the processing chamber 120 may implement one or more capacitively coupled plasmas (CCPs).

The lid assembly 304 includes an RF electrode 308. A gas inlet tube 310 extends through the RF electrode 308 and is further coupled to a gas manifold 312. A flow centering insert 314 can be disposed in the gas inlet tube 310. A gas source 316 is fluidly coupled to the gas inlet tube 310 via the gas manifold 312. The gas source 316 can provide a flow 318 of gas through the gas inlet tube 310, and further, through the flow centering insert 314. An RF power source 320 and RF matching network 322 are coupled to the RF electrode 308 and, hence, also to the gas inlet tube 310.

A blocker plate 324 is coupled to the RF electrode 308 and may be maintained at a same electrical potential as the RF electrode 308. The blocker plate 324 has apertures therethrough that permit gas to flow through the blocker plate 324. A gas distribution plate 326 is likewise coupled to the RF electrode 308 and may be maintained at a same electrical potential as the RF electrode 308. The gas distribution plate 326 is more distal from the RF electrode 308 than the blocker plate 324. The gas distribution plate 326 also has apertures therethrough that permit gas to flow through the gas distribution plate 326. The blocker plate 324 and gas distribution plate 326 can serve to redirect a flow of gas so that gas flow is more uniform on respective sides of the blocker plate 324 and gas distribution plate 326 opposite from the source of the gas in the chamber 120 (e.g., the gas inlet tube 310).

An insulator 330 separates and electrically insulates the gas distribution plate 326 from a gas distribution device 334. The gas distribution device 334 is grounded. The gas distribution device 334 is grounded and has apertures therethrough. Surfaces of the gas distribution plate 326, the gas distribution device 334, and the insulator 330 define a first plasma region 332 (e.g., a remote plasma region). A plasma may be generated in the first plasma region 332 when a flow 318 of gas is provided through the gas inlet tube 310, which passes through the blocker plate 324 and the gas distribution plate 326, and RF energy is provided by the RF power source 320 through the RF electrode 308 and the gas distribution plate 326. Plasma products (e.g., radicals, ions, and electrons) may pass through the gas distribution device 334 when a plasma is generated in the first plasma region 332. In general, the position of the grounded gas distribution device 334 between the gas distribution plate 326 and the process region 352 minimizes or prevents gases ionized in the plasma formed above the gas distribution device 334 from reaching the surface of the substrate during processing. The reduced exposure to an ion containing processing gas prevents or minimizes the amount of damage induced in the substrate due to the bombardment of the surface of the substrate by the plasma generated ions.

The gas distribution device 334 further has channels 336 fluidly coupled to a gas source 338 that may be used to introduce one or more additional gas on a side of the gas distribution device 334 distal from the first plasma region 332. The gas source 338 can provide a flow 340 of gas through the channels 336. A heating element 342 may be disposed in the gas distribution device 334 or other components and may facilitate a thermal distribution and maintenance of a plasma in the first plasma region 332.

The support assembly 306 includes a substrate support 348 supported by the chamber body 302. The support assembly 306 is configured to support a substrate 350. A second plasma region (e.g., a direct plasma region) is defined in a process region 352 between the gas distribution device 334 and the substrate 350. The gases from flow 318 and plasma products from the first plasma region 332 can pass through the gas distribution device 334 into the process region 352. The substrate support 348 is further connected to a RF power source 354 to provide a bias during processing. A plasma may be generated in the second plasma region in the process region 352 when a flow 340 of gas is provided through the channels 336 of the gas distribution device 334 and an RF energy is provided by the RF power source 354 to the substrate support 348.

The support assembly 306 can include an electrostatic chuck (ESC). The substrate support 348 may be coupled to an actuator 356 by a shaft 358 which extends through a centrally-located opening formed in a bottom of the chamber body 302. The actuator 356 may be flexibly sealed to the chamber body 302 by bellows (not shown) that prevent vacuum leakage from around the shaft 358. The actuator 356 allows the substrate support 348 to be moved vertically within the chamber body 302 between a process position and a lower, transfer position. The transfer position is slightly below a slit valve opening (not shown) formed in a sidewall of the chamber body 302. In operation, the substrate support 348 may be elevated to a position in close proximity to the lid assembly 304. Although not specifically illustrated, the substrate support 348 can include a heating element and cooling element to maintain the substrate 350 at a target temperature during processing.

A vacuum system, which may be part of the gas and pressure control system of the processing system 100, can be used to remove gases from the processing chamber 120. The vacuum system includes a vacuum pump 362 coupled to a vacuum port 364 disposed in the chamber body 302. The processing chamber 120 also includes a controller (not shown), which may be the system controller 190 or a controller controlled by the system controller 190, for controlling processes within the processing chamber 120.

Figure 4:
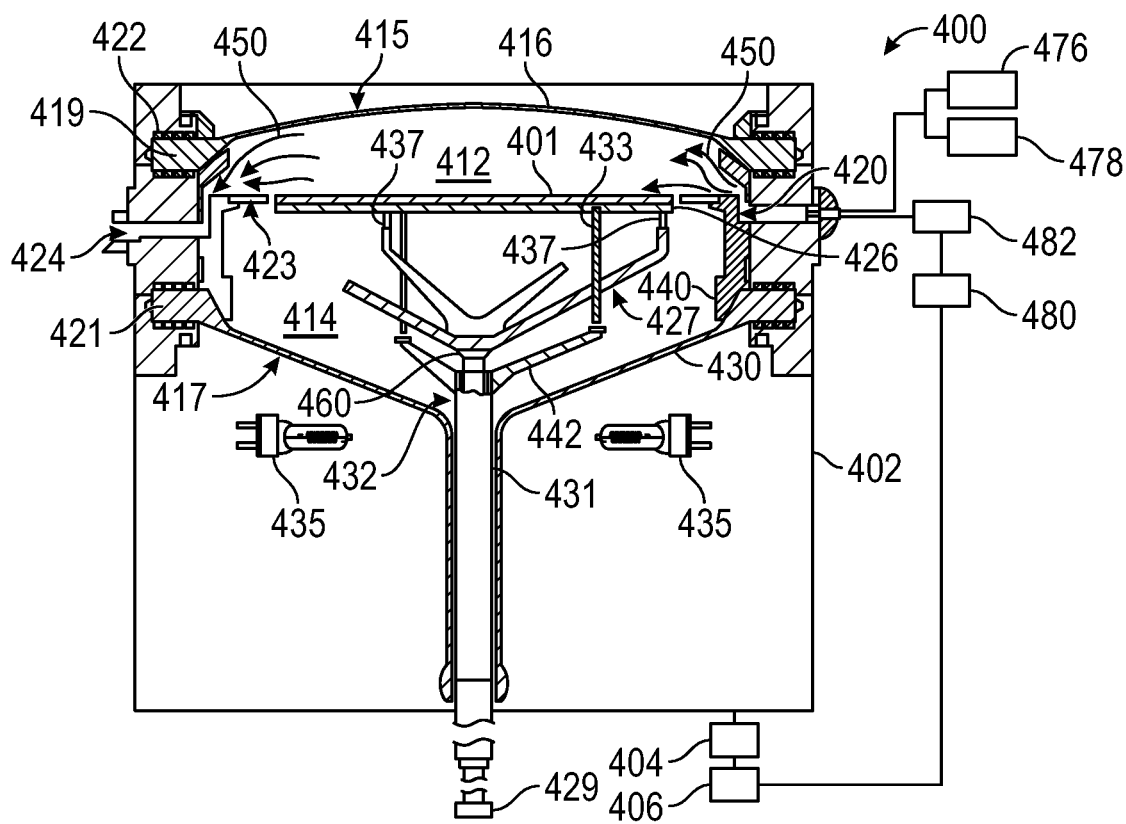
FIG. 4 is a cross-sectional view of a thermal processing chamber that may be used to perform epitaxial growth according to some examples of the present disclosure.

FIG. 4 is a cross-sectional view of a thermal processing chamber 400 that may be used to perform epitaxial growth. The processing chamber 400 includes a chamber body 402, support systems 404, and a controller 406. The chamber body 402 includes an upper portion 412 and a lower portion 414. The upper portion 412 includes the area within the chamber body 402 between an upper dome 416 and a substrate 401. The lower portion 414 includes the area within the chamber body 402 between a lower dome 430 and the bottom of the substrate 401. Deposition processes generally occur on the upper surface of the substrate 401 within the upper portion 412.

The support system 404 includes components used to execute and monitor pre-determined processes, such as the growth of epitaxial films in the processing chamber 400. A controller 406 is coupled to the support system 404 and is adapted to control the processing chamber 400 and support system 404. The controller 406 may be the system controller 190 or a controller controlled by the system controller 190 for controlling processes within the processing chamber 400.

The processing chamber 400 includes a plurality of heat sources, such as lamps 435, which are adapted to provide thermal energy to components positioned within the process chamber 400. For example, the lamps 435 may be adapted to provide thermal energy to the substrate 401, a susceptor 426, and/or the preheat ring 423. The lower dome 430 may be formed from an optically transparent material, such as quartz, to facilitate the passage of thermal radiation therethrough. It is contemplated that lamps 435 may be positioned to provide thermal energy through the upper dome 416 as well as the lower dome 430.

The chamber body 402 includes a plurality of plenums formed therein. The plenums are in fluid communication with one or more gas sources 476, such as a carrier gas, and one or more precursor sources 478, such as deposition gases and dopant gases. For example, a first plenum 420 may be adapted to provide a deposition gas 450 therethrough into the upper portion 412 of the chamber body 402, while a second plenum 424 may be adapted to exhaust the deposition gas 450 from the upper portion 412. In such a manner, the deposition gas 450 may flow parallel to an upper surface of the substrate 401.

In cases where a liquid precursor is used, the thermal processing chamber 400 may include a liquid vaporizer 480 in fluid communication with a liquid precursor source 482. The liquid vaporizer 480 is be used for vaporizing liquid precursors to be delivered to the thermal processing chamber 400. While not shown, it is contemplated that the liquid precursor source 482 may include, for example, one or more ampules of precursor liquid and solvent liquid, a shut-off valve, and a liquid flow meter (LFM).

A substrate support assembly 432 is positioned in the lower portion 414 of the chamber body 402. The substrate support assembly 432 is illustrated supporting a substrate 401 in a processing position. The substrate support assembly 432 includes a susceptor support shaft 427 formed from an optically transparent material and the susceptor 426 supported by the susceptor support shaft 427. A shaft 460 of the susceptor support shaft 427 is positioned within a shroud 431 to which lift pin contacts 442 are coupled. The susceptor support shaft 427 is rotatable in order to facilitate the rotation of the substrate 401 during processing. Rotation of the susceptor support shaft 427 is facilitated by an actuator 429 coupled to the susceptor support shaft 427. The shroud 431 is generally fixed in position, and therefore, does not rotate during processing. Support pins 437 couple the susceptor support shaft 427 to the susceptor 426.

Lift pins 433 are disposed through openings (not labeled) formed in the susceptor support shaft 427. The lift pins 433 are vertically actuatable and are adapted to contact the underside of the substrate 401 to lift the substrate 401 from a processing position (as shown) to a substrate removal position.

The preheat ring 423 is removably disposed on a lower liner 440 that is coupled to the chamber body 402. The preheat ring 423 is disposed around the internal volume of the chamber body 402 and circumscribes the substrate 401 while the substrate 401 is in a processing position. The preheat ring 423 facilitates preheating of a process gas as the process gas enters the chamber body 402 through the first plenum 420 adjacent to the preheat ring 423.

The central window portion 415 of the upper dome 416 and the bottom portion 417 of the lower dome 430 may be formed from an optically transparent material such as quartz. The peripheral flange 419 of the upper dome 416, which engages the central window portion 415 around a circumference of the central window portion 415, the peripheral flange 421 of the lower dome 430, which engages the bottom portion around a circumference of the bottom portion, may all be formed from an opaque quartz to protect the O-rings 422 proximity to the peripheral flanges from being directly exposed to the heat radiation. The peripheral flange 419 may be formed of an optically transparent material such as quartz.

Figure 5:
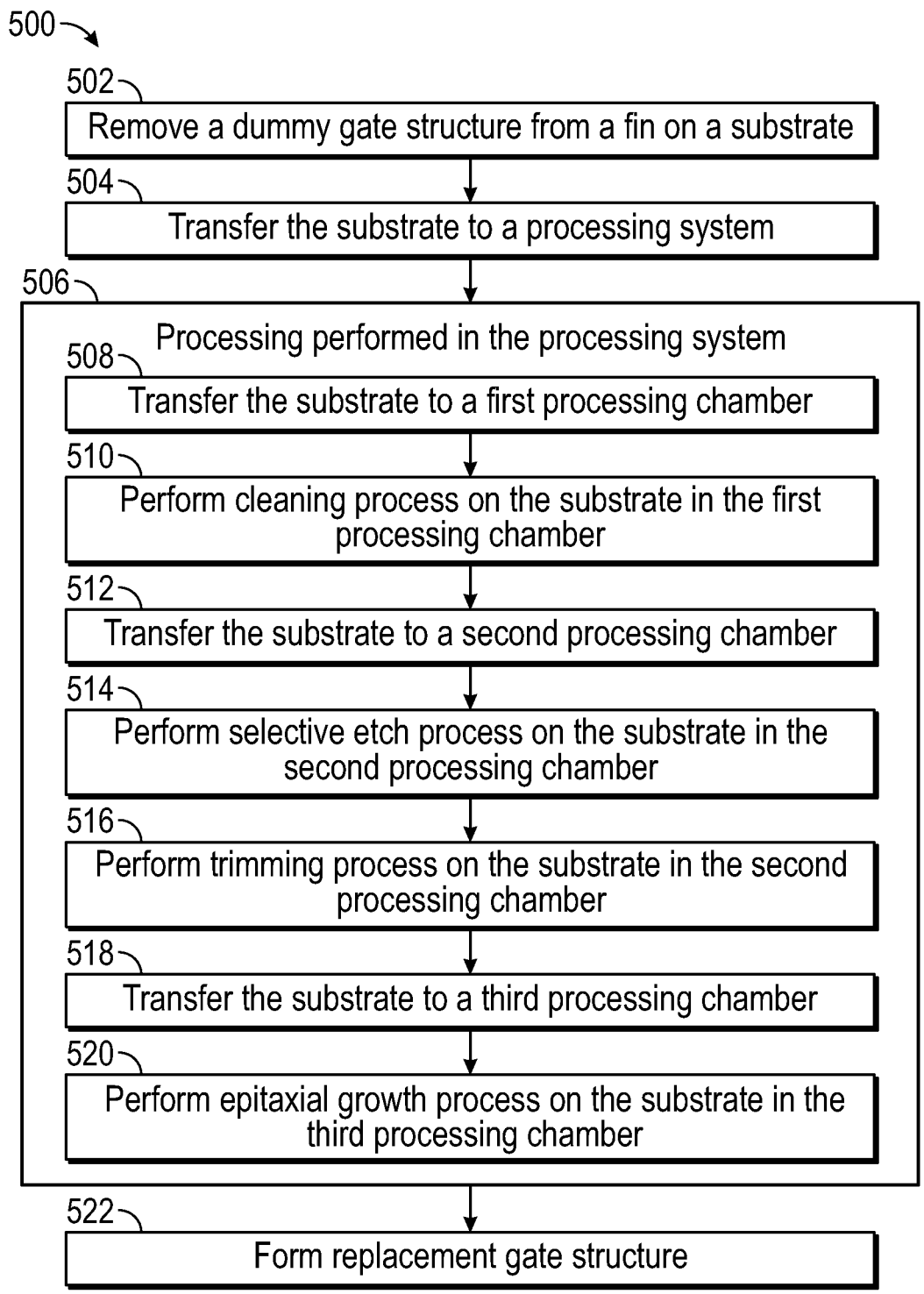
FIG. 5 is a flowchart of a method of semiconductor processing according to some examples of the present disclosure.

FIG. 5 is a flowchart of a method 500 of semiconductor processing according to some examples of the present disclosure. FIGS. 6 through 13B illustrate aspects of the method 500 of FIG. 5 according to some examples of the present disclosure. Examples described herein are in the context of a p-type field effect transistor (FET), such as a horizontal gate all around (hGAA) FET. A person having ordinary skill in the art will readily understand variations to the described examples to implement an n-type FET, such as an hGAA FET, including using, e.g., different materials, doping, etc., and such variations are contemplated within the scope of other examples.

Figure 6:
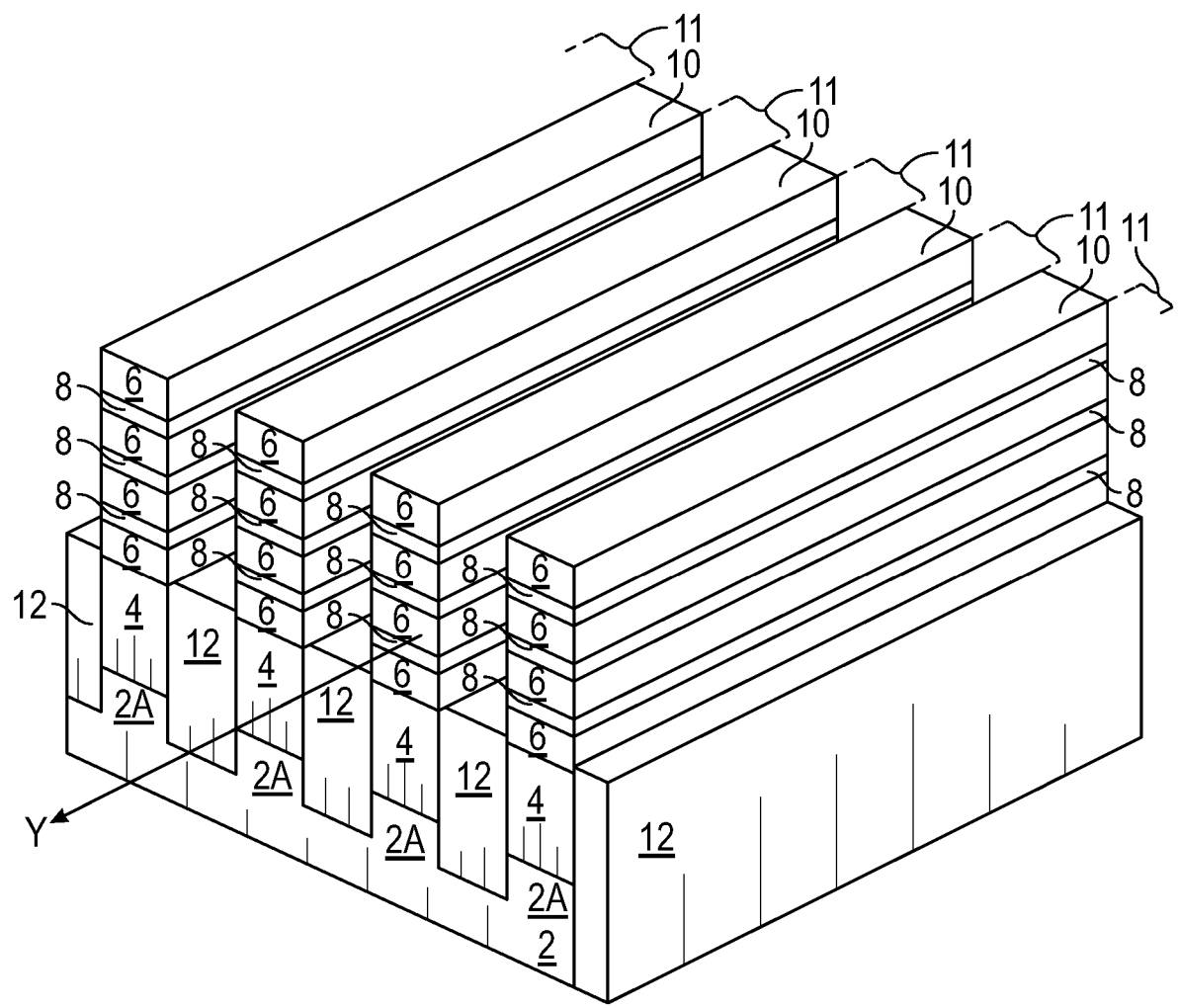

FIG. 6 illustrates a three-dimensional intermediate structure during processing according to some examples. To obtain the intermediate structure of FIG. 6, a substrate 2 is provided. The substrate 2 can be any appropriate semiconductor substrate, such as a bulk substrate, semiconductor-on-insulator (SOI) substrate, or the like. In some examples, the substrate 2 is a bulk silicon wafer. Examples of substrate sizes include 200 mm diameter, 350 mm diameter, 400 mm diameter, and 450 mm diameter, among others. An n-well 4 is formed in the substrate 2. The n-well can be formed using ion implantation to implant n-type dopants in the substrate 2, for example. Example n-type dopants include arsenic, phosphorous, the like, or a combination thereof. A superlattice is formed on the substrate 2. The superlattice includes alternating layers 6, 8 of different materials. In some examples, the alternating layers 6, 8 are silicon germanium ($Si_{1-x}Ge_x$, where x is in a range from about 0.10 to about 0.40) and silicon, respectively. In such examples, a thickness of the silicon germanium layers 6 can be in a range from about 5 nm to about 10 nm, and a thickness of the silicon layers 8 can be in a range from about 5 nm to about 10 nm. A total number of alternating layers 6, 8 in the superlattice can be in a range from 1 to 5. The alternating layers 6, 8 of the superlattice can be formed using any appropriate epitaxial growth process.

Fins 10 are then formed on the substrate 2. The fins 10 can be formed by etching trenches 11 that extend in the Y-direction through the formed superlattice and into the substrate 2 (e.g., through the n-well 4) such that each fin 10 is defined between a neighboring pair of trenches. The trenches may be etched using a multiple patterning process, such as selfaligned double patterning (SADP), lithography-etch-lithography-etch (LELE) double patterning, etc., to achieve a target pitch between fins 10. An example etch process to etch the trenches includes a reactive ion etch (RIE) process or the like. As illustrated in FIG. 6, each fin 10 includes the superlattice (of the alternating layers 6, 8), an n-well 4 in the substrate 2, and a portion 2A of the substrate 2.

Isolation structures 12 are formed in the trenches between the fins 10. In some examples, the isolation structures 12 may be referred to as shallow trench isolations (STIs). A liner layer (not shown) can be conformally formed along the trenches to form a hermetic barrier to the fins 10, and a dielectric material can be formed on the liner layer in the trenches. The liner layer can be a nitride (e.g., silicon nitride) deposited by atomic layer deposition (ALD), chemical vapor deposition (CVD), or the like, for example. The dielectric material can be an oxide (e.g., silicon oxide) deposited by flowable CVD (FCVD) or the like, for example. The dielectric material and liner layer are then recessed to form the isolation structures 12 such that the fins 10 protrude above the isolation structures 12. Hence, in some examples, the isolation structures 12 include a liner layer along fins 10 and a dielectric material formed on the liner layer. In the illustrated example, top surfaces of the isolation structures 12 are at or above the respective top surfaces of the substrate 2 that form at least a portion of the fins 10. In other examples, the top surfaces of the isolation structures 12 can be at different levels, such as below the top surfaces of the substrate 2.

Figure 7A:
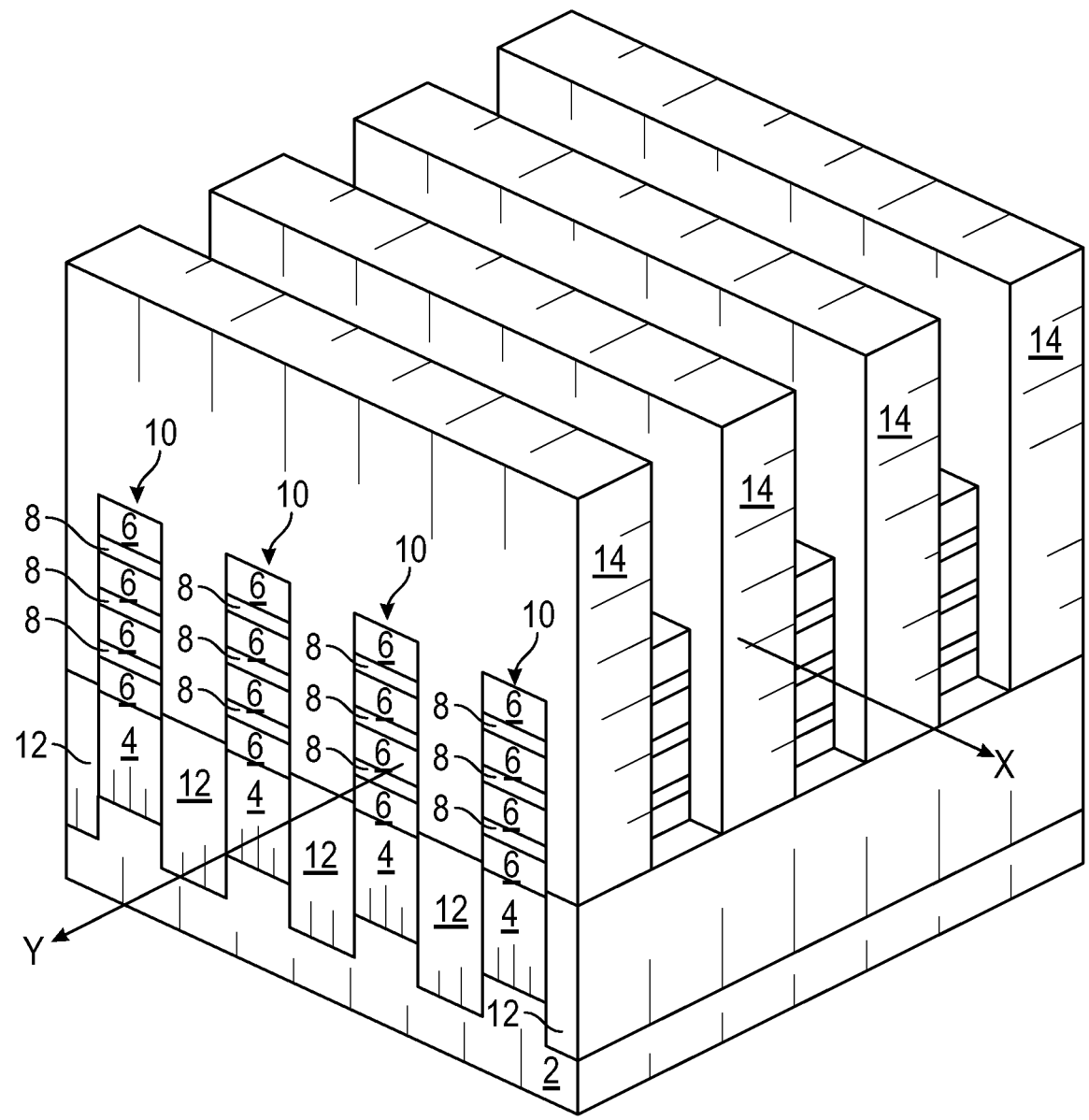
Figure 7B:
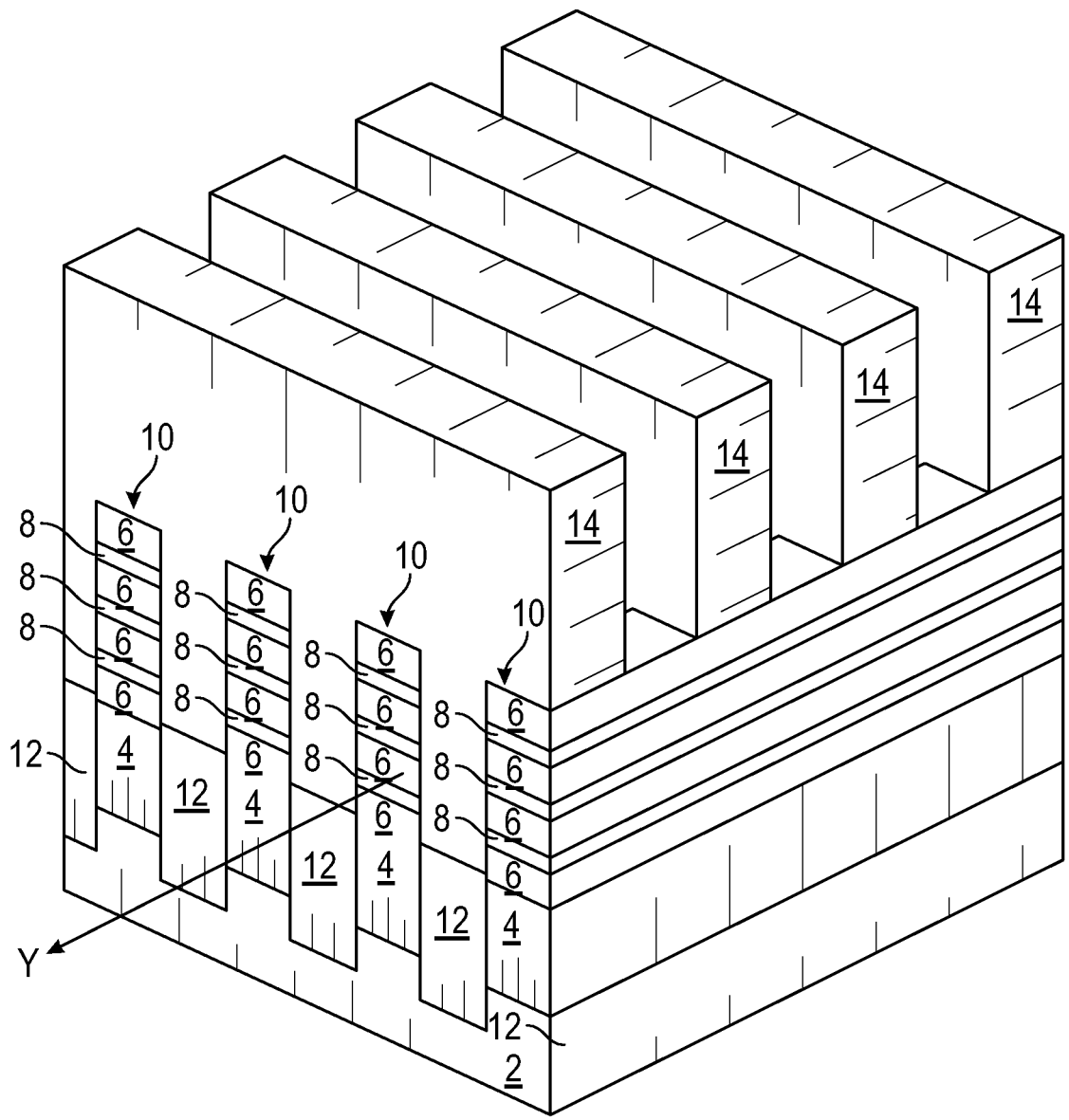

FIG. 7A illustrates a three-dimensional intermediate structure after further processing according to some examples. The intermediate structure illustrates cross-section X-X and cross-section Y-Y, which are perpendicular to each other. Cross-section X-X is along a longitudinal direction of a fin 10 (e.g., across source/drain regions and channel regions in the fin 10), and cross-section Y-Y is along a longitudinal direction of a dummy gate structure 14 (e.g., across channel regions in respective fins). FIG. 7B illustrates the three-dimensional intermediate structure of FIG. 7A with a portion of the intermediate structure cut away along a plane parallel to the cross-section Y-Y to expose a fin 10 longitudinally. Cross-section Y-Y corresponds to subsequent figures ending in an "A" during subsequent processing, and cross-section X-X corresponds to subsequent figures ending in a "B" during the subsequent processing.

Dummy gate structures 14 are formed on the fins 10. Each dummy gate structure 14 can include an interfacial dielectric layer (not shown) along the fins 10, a dummy gate layer on the interfacial dielectric layer, and a mask layer on the dummy gate layer. For example, the interfacial dielectric layer can be formed on the fins 10 using oxidation (e.g., plasma, chemical and/or thermal oxidation) or can be deposited using an appropriate deposition process (e.g., ALD, CVD, etc.). The dummy gate layer can then be deposited (e.g., by CVD, physical vapor deposition (PVD), etc.) on the interfacial dielectric layer and planarized (e.g., by a chemical mechanical planarization (CMP)). The mask layer can then be deposited (e.g., by CVD, PVD, etc.) on the dummy gate layer. In some examples, the interfacial dielectric layer is an oxide; the dummy gate layer is silicon, such as amorphous silicon and/or polysilicon; and the mask layer is silicon nitride, silicon carbon nitride, silicon oxynitride, etc. The mask layer, dummy gate layer, and interfacial dielectric layer are then patterned into the dummy gate structures 14 illustrated in FIGS. 7A and 7B using an appropriate etch process, such as a RIE or the like.

FIGS. 8A and 8B illustrate cross-sectional views of an intermediate structure after further processing according to some examples. Gate spacers 16 are formed along sidewalls of the dummy gate structures 14. One or more dielectric layers can be deposited conformally along the surfaces of the fins 10, isolation structures 12, and dummy gate structures 14 and anisotropically etched such that portions of the one or more dielectric layers remain along the sidewalls of the dummy gate structures 14 to form the gate spacers 16. The one or more layers of the gate spacers 16 can be or include silicon nitride, silicon carbon nitride, silicon oxynitride, silicon carbon oxynitride, etc., and can be deposited using ALD, plasma-enhanced CVD (PECVD), the like, or a combination thereof. The one or more dielectric layers can be anisotropically etched using RIE or the like.

Epitaxial source/drain regions 18 are then formed in the fins 10 on opposing sides of the dummy gate structures 14. Recesses are formed in the fins 10. For example, an etch process can be performed using the dummy gate structures 14 (e.g., the mask layers of the dummy gate structures 14) and the gate spacers 16 as masks for the etch process. The etch process can be anisotropic and/or isotropic. For example, the etch process can be a RIE or the like, or can be a wet etch, such as using tetramethylammonium hydroxide (TMAH) or the like. The epitaxial source/drain regions 18 can then be epitaxially grown in the recesses. For a p-type FET, the epitaxial source/drain regions 18 can be or include silicon germanium ($Si_{1-x}Ge_x$, where x is in a range from about 0.05 to about 0.75) or another appropriate material, which may be doped with a p-type dopant, such as boron, to a concentration in a range from about $1\times10^{20}$ $cm^{-3}$ to about $1\times10^{22}$ $cm^{-3}$. In some examples, an epitaxial liner layer can be deposited along surfaces of the recesses before a bulk material of the epitaxial source/drain regions 18 is deposited. The epitaxial liner layer can provide for etch selectivity during subsequent processing. The epitaxial growth may be performed using low pressure CVD (LPCVD), metal-organic CVD (MOCVD), liquid phase epitaxy (LPE), the like, or a combination thereof. As illustrated in FIG. 8A, the recesses, and hence, the epitaxial source/drain regions 18, are formed to the respective top surfaces of the substrate 2 in the fins 10. In other examples, the recesses can be formed to different levels, such as having a bottom surface in the superlattice above the top surfaces of the substrate 2 or below the top surfaces of the substrate 2.

A contact etch stop layer (CESL) 20 is conformally formed on surfaces of the dummy gate structures 14, gate spacers 16, epitaxial source/drain region 18, and isolation structures 12. The CESL 20 can be or include silicon nitride, silicon oxynitride, silicon carbon oxynitride, silicon carbon nitride, etc. deposited by ALD, PECVD, the like, or a combination thereof. An interlayer dielectric (ILD0) 22 is formed on the CESL 20. The ILD0 22 can be or include silicon oxide, silicon carbon oxide, borosilicate glass (BSG), phosphosilicate glass (PSG), borophosphosilicate glass (BPSG), fluorosilicate glass (FSG), a low-k dielectric, the like, or a combination thereof, and can be deposited by CVD, PVD, the like, or a combination thereof.

FIGS. 9A and 9B illustrate cross-sectional views of an intermediate structure after further processing according to some examples. According to block 502 in the method 500 of FIG. 5, the dummy gate structure is removed. The ILD0 22 and CESL 20 are planarized, such as by a CMP process, to expose the dummy gate structure 14. The planarization may also remove the mask layer of the dummy gate structure 14. The dummy gate layer of the dummy gate structure 14 is then removed, such as by a wet or dry etch process selective to the material of the dummy gate layer, which may use the interfacial dielectric layer as an etch stop. The interfacial dielectric layer may also be removed or may remain.

According to block 504, the substrate 2 having the intermediate structure of FIGS. 9A and 9B is then transferred to a processing system, such as the processing system 100 of FIG. 1. For example, the substrate 2 is transferred by a FOUP 144 to the factory interface 102, where a factory interface robot 142 further transfers the substrate 2 from the FOUP 144 to a load lock chamber 104 or 106 through a port 150 or 152. The load lock chamber 104 or 106 is then pumped down as described above. Subsequent transfers and processing are performed in the processing system 100, as shown by block 506, e.g., without exposing the substrate 2 to an atmospheric ambient environment outside of the processing system and without breaking a low pressure or vacuum environment maintained within the transfer apparatus of the processing system 100. The processing illustrated in block 506 is merely an example. Some processes in block 506 may not be performed in the processing system 100, and/or additional process may be performed in the processing system 100.

In block 508, the substrate 2 is transferred to a first processing chamber, e.g., processing chamber 122, of the processing system 100. For example, the transfer robot 110 transfers the substrate 2 from the load lock chamber 104 or 106 through a port 154 or 156 to the processing chamber 122 through the port 164. In block 510, a cleaning process is performed on the substrate 2 in the processing chamber 122. The cleaning process can be the SiCoNi® Preclean process. The cleaning process can remove any interfacial dielectric layer and/or native oxide formed on the fins 10 where the dummy gate structures 14 (e.g., dummy gate layers) were removed. The cleaning process can clean the alternating layers 6, 8, such as by removing an oxide from the alternating layers 6, 8.

In some examples performed with the processing chamber 122 illustrated in FIG. 2, the cleaning process includes flowing a mixture of nitrogen trifluoride ($NF_3$) and helium (He) from gas inlet 226, and flowing ammonia ($NH_3$) from gas inlet 225. The mixture of nitrogen trifluoride ($NF_3$) and helium (He) can be in a ratio in a range from 1:350 ($NF_3$:He) to 1:120 ($NF_3$:He), which mixture can be flowed from gas inlet 226 at a flow rate in a range from 5000 sccm to 7000 sccm, such as with a flow rate of trifluoride ($NF_3$) in a range from 10 sccm to 25 sccm, and a flow rate of helium (He) in a range from about 3000 sccm to 3500 sccm. A pressure in the chamber 122 can be maintained in a range from 0.25 Torr to about 2 Torr. A power applied by the RF power source 224 can be in a range from about 10 W to about 50 W at a frequency in a range from about 10 MHz to about 20 MHz (e.g., 13.56 MHz).

Figure 10B:
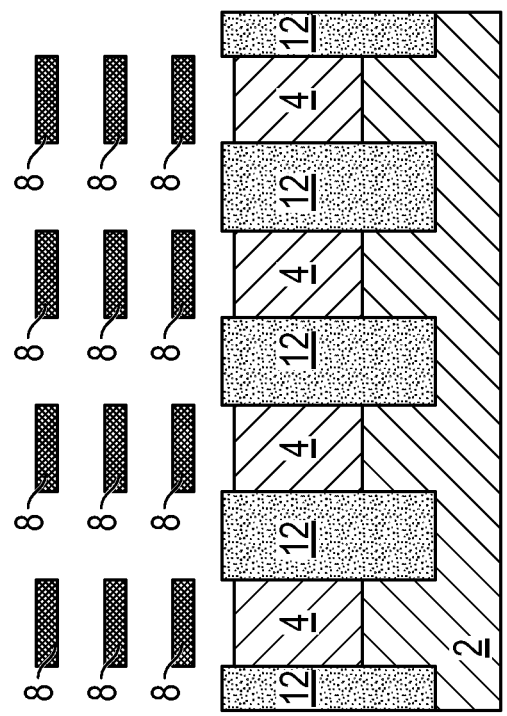
Figure 10A:
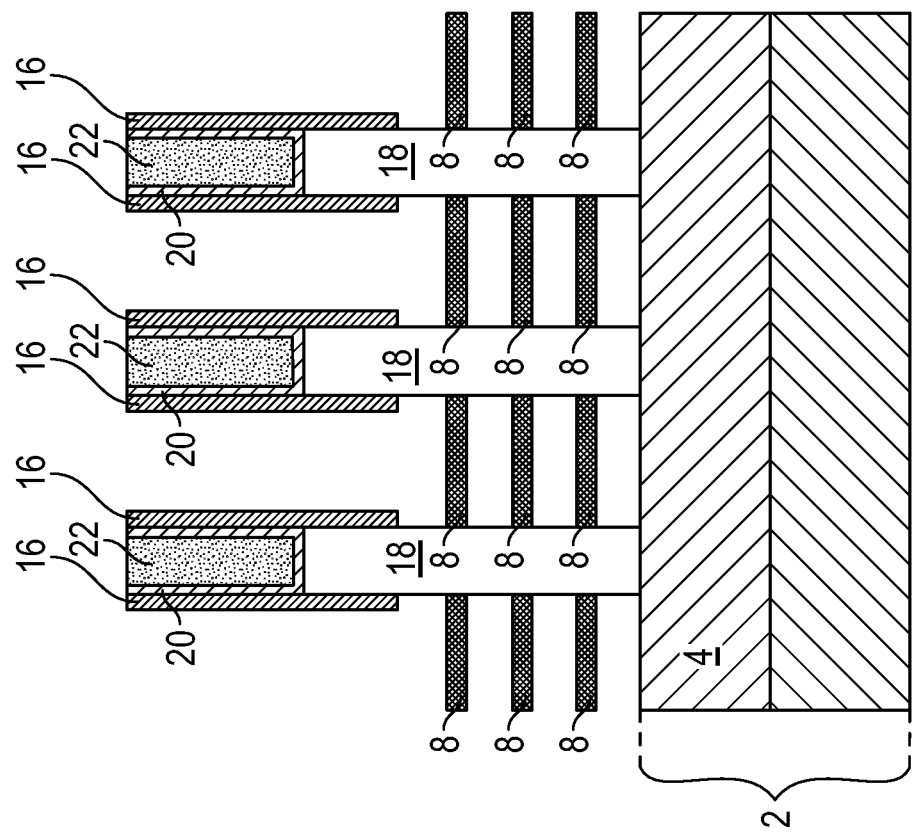

After the cleaning process is performed in the processing chamber 122, in block 512, the substrate 2 is transferred to a second processing chamber, e.g., processing chamber 120, of the processing system 100. For example, the substrate 2 is transferred by the transfer robot 110 from the processing chamber 122 through the port 164 to the processing chamber 120 through the port 162. In block 514, a selective etch process is performed on the substrate 2 in the processing chamber 120. FIGS. 10A and 10B illustrate cross-sectional views of an intermediate structure after the selective etch process according to some examples. Layers 6 of the alternating layers 6, 8 of the superlattice in the fins 10 are selectively removed by the selective etch process (e.g., an isotropic etch process). The processing chamber 120 can be the Selectra® Etch system, which can perform the selective etch process. In some examples, silicon germanium is selectively etched as performed with the processing chamber 120 illustrated in FIG. 3.

After the selective etch process is performed in the processing chamber 120, in block 516, a trimming process is performed on the substrate 2 in the processing chamber 120. FIGS. 11A and 11B illustrate cross-sectional views of an intermediate structure after the trimming process according to some examples. Layers 8 of the superlattice in the fins 10 are trimmed by the trimming process to form trimmed layers 8'. A conformal thickness in a range from about 2 nm to about 3 nm can be trimmed from the layers 8 to form the trimmed layers 8'. Like with the selective etch process, the trimming process can be by the Selectra® Etch system.

In some examples performed with the processing chamber 120 illustrated in FIG. 3 to trim silicon, the trimming process includes flowing a first etch gas, which may include one or more of nitrogen trifluoride ($NF_3$), a mixture of nitrogen trifluoride ($NF_3$) and helium (He), or the like, from the gas source 316 by flow 318, and flowing a second etch gas, which may include one or more of nitrogen trifluoride ($NF_3$) or the like, from the gas source 338 by flow 340. A mixture of nitrogen trifluoride ($NF_3$) and helium (He) can be in a ratio in a range from 1:350 ($NF_3$:He) to 1:120 ($NF_3$:He), which mixture can be flowed from gas source 316 at a flow rate in a range from 5000 sccm to 7000 sccm, such as with a flow rate of trifluoride ($NF_3$) in a range from 10 sccm to 25 sccm, and a flow rate of helium (He) in a range from about 3000 sccm to 3500 sccm. A pressure in the chamber 120 can be maintained in a range from 0.25 Torr to about 2 Torr. A power applied by the RF power source 320 can be in a range from about 10 W to about 50 W at a frequency from about 10 MHz to about 50 MHz (e.g., 13.56 MHz).

Figure 12B:
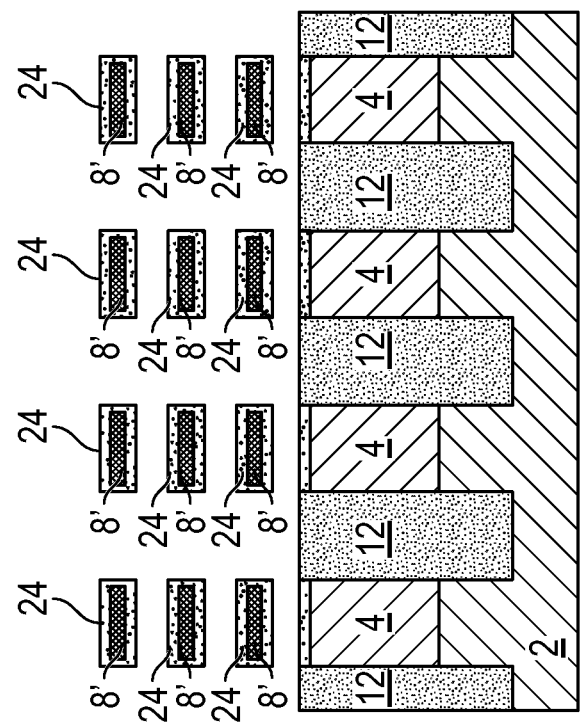
Figure 12A:
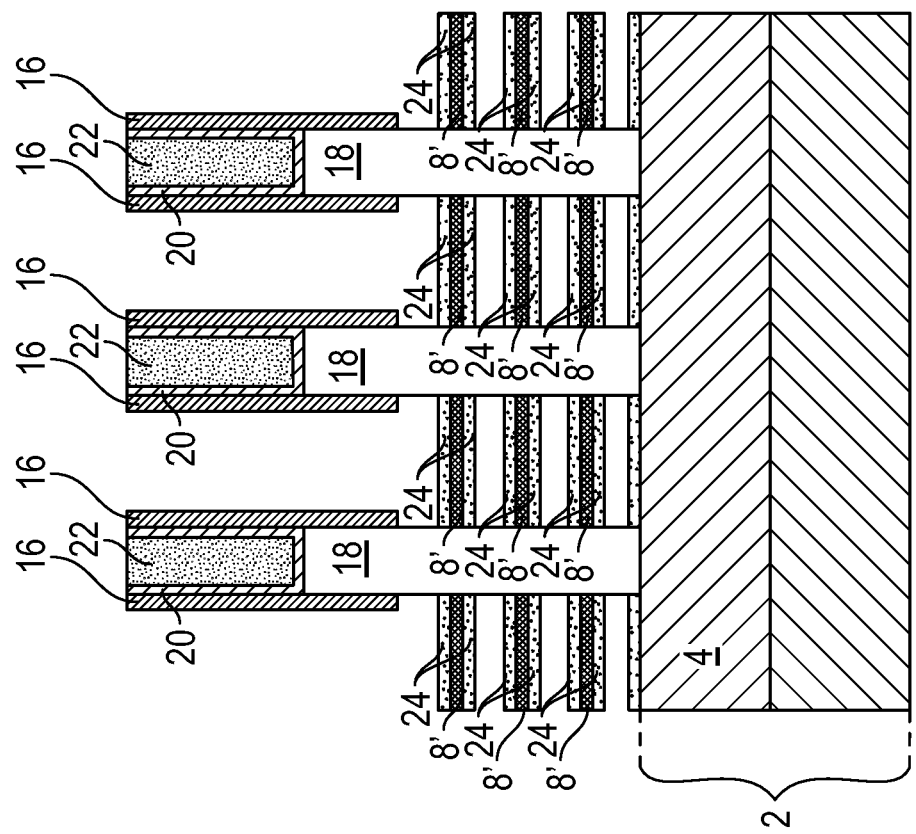

After the trimming process is performed in the processing chamber 120, in block 518, the substrate 2 is transferred to a third processing chamber, e.g., processing chamber 124, 126, 128, or 130, of the processing system 100. For example, the substrate 2 is transferred by the transfer robot 110 from the processing chamber 120 through the port 162 to a holding chamber 112 or 114 through a port 158 or 160. The substrate 2 is then transferred by the transfer robot 118 from the holding chamber 112 or 114 through a port 166 or 168 to one of the processing chambers 124, 126, 128, 130 through a port 170, 172, 174, 176. As an example for brevity of description, the substrate 2 is transferred to the processing chamber 124. In block 520, an epitaxial growth process is performed on the substrate 2 in the processing chamber 124. FIGS. 12A and 12B illustrate cross-sectional views of an intermediate structure after the epitaxial growth process according to some examples. The epitaxial growth process forms cladding layers 24 on the trimmed layers 8' and exposed surfaces of the substrate 2. The cladding layers 24 are on the exposed surfaces of the trimmed layers 8' and substrate 2 and extend between neighboring epitaxial source/drain regions 18. The cladding layers 24 can be stressed (e.g., with a compressive stress) and can form at least part of channel regions of respective hGAA FETs. In examples where the layers 8 of the superlattice are silicon, the cladding layers 24 can be silicon germanium ($Si_{1-x}Ge_x$, where x is in a range from about 0.05 to about 0.75). Transferring the substrate 2 within the single processing system 100 permits transfer of the substrate 2 without exposing the substrate 2 to an atmospheric ambient environment exterior to the processing system 100 (e.g., the fab environment). By avoiding exposure of the substrate 2 to such atmospheric ambient environment, a cleaning process between the processing in the processing chamber 120 and the processing in the processing chamber 124 can be avoided, such as a result of no oxidation occurring due to exposure to such atmospheric ambient environment.

In some examples performed with the processing chamber 400 (e.g., processing chamber 124, 126, 128, or 130) illustrated in FIG. 4 to epitaxially grow silicon germanium, the epitaxial growth process includes flowing a silicon-containing precursor, such as silane ($SiH_4$), disilane ($Si_2H_6$), trisilane ($Si_3H_8$), tetrasilane ($Si_4H_{10}$), or the like, and flowing a germanium-containing precursor, such as germanium tetrachloride ($GeCl_4$), chlorogermane ($GeH_3Cl$), dichlorogermane ($GeH_2Cl_2$), trichlorogermane ($GeHCl_3$), hexachlorodigermane ($Ge_2Cl_6$), octachlorotrigermane ($Ge_3Cl_8$), or the like. The silicon-containing precursor can be flowed at a flow rate in a range from 5 sccm to 200 sccm. The germanium-containing precursor can be flowed at a flow rate in a range from 50 sccm to 1200 sccm. A pressure in the processing chamber 400 can be maintained in a range from 5 Torr to about 300 Torr. The epitaxial growth process can be performed at a temperature in a range from about 560° C. to about 750° C.

After the epitaxial growth process in, e.g., the processing chamber 124, the substrate 2 can be transferred by the transfer robot 118 from the processing chamber 124 through the port 170 to another processing chamber 126, 128, 130 through a port 172, 174, 176 (e.g., for deposition of subsequent layers, such as a gate dielectric layer, work-function tuning layer(s), and/or metal fill described below) and/or then is transferred to a holding chamber 112 or 114 through a port 166 or 168. The substrate 2 can then be transferred by the transfer robot 110 from the holding chamber 112 or 114 through the port 158 or 160 to another processing chamber 120, 122 through a port 162, 164 and/or then is transferred to a load lock chamber 104 or 106 through a port 154 or 156. The substrate 2 is then transferred out of the load lock chamber 104 or 106 through a port 150 or 152 by a factory interface robot 142 to a FOUP 144. The substrate 2 can then be transported to other processing systems to undergo further processing.

FIGS. 13A and 13B illustrate cross-sectional views of an intermediate structure after further processing according to some examples. In block 522 of the method 500, replacement gate structures are formed where the dummy gate structures 14 were removed and on the cladding layers 24. The replacement gate structures each include a gate dielectric layer 26, one or more work-function tuning layers 28, and a metal fill 30. The gate dielectric layer 26 can be or include a metal oxide (which may be a high-k dielectric (e.g., with a k-value greater than about 3.9), such as hafnium oxide, tantalum oxide, aluminum oxide, zirconium oxide, or the like) and/or other dielectric materials (such as silicon nitride). The work-function tuning layer(s) 28 can be or include titanium aluminum, titanium nitride, titanium aluminum carbide, tantalum aluminum, tantalum nitride, tantalum aluminum carbide, tungsten, or cobalt. The metal fill 30 can be or include cobalt, tungsten, aluminum, titanium aluminum, or the like. The gate dielectric layer 26 is conformally deposited on surfaces of and around the cladding layers 24, on sidewalls of the gate spacers 16, on exposed surfaces of the epitaxial source/drain regions 18, and on top surfaces of the isolation structures 12. The work-function tuning layer(s) 28 are conformally deposited on the gate dielectric layer 26 and further around the cladding layers 24. The gate dielectric layer 26 and work-function tuning layer(s) 28 can be deposited by ALD, PECVD, molecular beam deposition (MBD), the like, or a combination thereof. The gate dielectric layer 26 and work-function tuning layer(s) 28 can be deposited in processing chambers of the processing system 100, such as processing chambers 124, 126, 128, 130, or of another processing system. The metal fill 30 is deposited on the work-function tuning layer(s) 28, and in some instances, around the cladding layers 24. The metal fill 30 can be deposited by ALD, CVD, PVD, the like, or a combination thereof. The metal fill 30 can be deposited in processing chambers of the processing system 100, such as processing chambers 124, 126, 128, 130, or of another processing system. Any excess metal fill 30, work-function tuning layer(s) 28, and gate dielectric layer 26 (e.g., on the top surface of the ILD0 22) can be removed by a planarization process, such as a CMP, to form the replacement gate structures as illustrated in FIGS. 13A and 13B.

An interlayer dielectric (ILD1) 32 is formed on the ILD0 22 and replacement gate structures. The ILD1 32 can be or include the same materials, and can be deposited using the same processes, as described above for the ILD0 22. Contacts 34 are formed through the ILD1 32, ILD0 22, and CESL 20 to respective epitaxial source/drain regions 18. The contacts 34 can include a silicide on the respective epitaxial source/drain regions 18, an adhesion or glue layer along dielectric sidewalls (e.g., of the ILD1 32, ILD0 22, and CESL 20), a barrier layer along the dielectric sidewalls, and/or a metal fill. Many different techniques for may be used to form the contacts 34, which will be readily apparent to a person having ordinary skill in the art. Generally, contact openings are etched through the ILD1 32, ILD0 22, and CESL 20 to the epitaxial source/drain regions 18, and the contacts 34 are formed in the contact openings.

In examples described herein, the processing for removing layers 6 of the superlattice, trimming the remaining layers 8 of the superlattice, and epitaxially growing the cladding layers 24 on the trimmed layers 8' is performed in a single processing system 100. Performing this processing in the single processing system 100 permits transfer of the substrate 2 between different chambers for different processing without exposing the substrate 2 to an atmospheric ambient environment exterior to the processing system 100 (e.g., the fab environment). By avoiding exposure of the substrate to such atmospheric ambient environment, cleaning processes between the different processing can be avoided, such as a result of no oxidation occurring due to exposure to such atmospheric ambient environment. Avoiding these cleaning processes can reduce costs of processing and reduce Q-Time. Accordingly, examples described herein provide for an integrated solution to the processing for removing layers 6 of the superlattice, trimming the remaining layers 8 of the superlattice, and epitaxially growing the cladding layers 24 on the trimmed layers 8'.

While the foregoing is directed to various examples of the present disclosure, other and further examples may be devised without departing from the basic scope thereof, and the scope thereof is determined by the claims that follow.

The invention claimed is:
1. A method for semiconductor processing, the method comprising:
selectively etching a first material in a first processing chamber of a processing system, the first material being disposed within alternating layers of the first material and a second material in a channel region on a substrate;
trimming a portion of the second material in the first processing chamber of the processing system;

transferring the substrate from the first processing chamber of the processing system to a second processing chamber of the processing system without exposing the substrate to an ambient environment exterior to the processing system; and epitaxially growing a cladding layer on respective layers of the trimmed second material in the second processing chamber of the processing system.

2. The method of claim 1 further comprising:
cleaning the alternating layers of the first material and the second material in a third processing chamber of the processing system, wherein cleaning the alternating layers comprises removing an oxide from one or more of the alternating layers before selectively etching the first material in the first processing chamber; and
transferring the substrate from the third processing chamber of the processing system to the first processing chamber of the processing system without exposing the substrate to the ambient environment exterior to the processing system.

3. The method of claim 1, wherein no cleaning process is performed after trimming the second material and before epitaxially growing the cladding layer.

4. The method of claim 1, wherein the substrate is transferred from the first processing chamber of the processing system to the second processing chamber of the processing system in a transfer environment with a pressure less than or equal to 300 Torr without removing the transfer environment during the transferring.

5. The method of claim 1, wherein the processing system includes a transfer apparatus comprising one or more transfer chambers, the first processing chamber and the second processing chamber being coupled to the transfer apparatus, the substrate being transferred from the first processing chamber of the processing system to the second processing chamber of the processing system in the transfer apparatus.

6. The method of claim 1, wherein the alternating layers form at least a portion of a fin on the substrate before the first material is selectively etched.

7. The method of claim 1, wherein the first material is silicon germanium, the second material is silicon, and the cladding layer is silicon germanium.

8. The method of claim 1 further comprising forming a gate structure on the cladding layer.

9. A semiconductor processing system comprising:
a transfer apparatus;
a first processing chamber coupled to the transfer apparatus;
a second processing chamber coupled to the transfer apparatus; and
a system controller configured to:
control a selective etch process performed in the first processing chamber, the selective etch process selectively removing a first material disposed within alternating layers of the first material and a second material in a channel region on a substrate;
control a trimming process performed in the first processing chamber, the trimming process trimming a portion of the second material;
control a transfer of the substrate from the first processing chamber to the second processing chamber through the transfer apparatus; and
control an epitaxial growth process performed in the second processing chamber, the epitaxial growth process depositing a cladding layer on respective layers of the trimmed second material.

10. The semiconductor processing system of claim 9 further comprising a third processing chamber, wherein the system controller is configured to:
control a cleaning process performed in the third processing chamber, the cleaning process cleaning the substrate; and
control a transfer of the substrate from the third processing chamber to the first processing chamber through the transfer apparatus.

11. The semiconductor processing system of claim 9, wherein the system controller is configured to prevent an atmospheric ambient environment exterior to the transfer apparatus from entering the transfer apparatus during the transfer of the substrate from the first processing chamber to the second processing chamber.

12. The semiconductor processing system of claim 9, wherein the system controller is configured to maintain a pressure in the transfer apparatus less than or equal to 300 Torr during the transfer of the substrate from the first processing chamber to the second processing chamber.

13. The semiconductor processing system of claim 9, wherein the transfer apparatus includes:
a first transfer chamber coupled to the first processing chamber;
a holding chamber coupled to the first transfer chamber; and
a second transfer chamber coupled to the holding chamber and the second processing chamber, wherein the substrate is transferred through the first transfer chamber, the holding chamber, and the second transfer chamber when the substrate is transferred from the first processing chamber to the second processing chamber.

14. The semiconductor processing system of claim 9 further comprising:
a load lock chamber coupled to the transfer apparatus; and
a factory interface coupled to the load lock chamber, wherein the substrate is transferred from the factory interface through the load lock chamber to the transfer apparatus.

15. A semiconductor processing system, comprising:
a non-transitory computer-readable medium storing instructions that, when executed by a processor, cause a computer system to perform the operations of:
controlling a selective etch process in a first processing chamber of a processing system, the selective etch process selectively removing a first material disposed within alternating layers of the first material and a second material in a channel region on a substrate;
controlling a trimming process in the first processing chamber, the trimming process trimming a portion of the second material;
controlling a transfer of the substrate from the first processing chamber to a second processing chamber of the processing system through a transfer apparatus of the processing system, the first processing chamber and the second processing chamber being coupled to the transfer apparatus; and
controlling an epitaxial growth process in the second processing chamber, the epitaxial growth process depositing a cladding layer on respective layers of the trimmed second material.

16. The semiconductor processing system of claim 15, wherein controlling the transfer of the substrate from the first processing chamber to the second processing chamber is performed without exposing the substrate to an ambient environment exterior to the processing system.

17. The semiconductor processing system of claim 15, wherein controlling the transfer of the substrate from the first processing chamber to the second processing chamber includes controlling the transfer of the substrate in a transfer environment with a pressure less than or equal to 300 Torr in the transfer apparatus.

18. The semiconductor processing system of claim 15, wherein the instructions that, when executed by the processor, do not cause the computer system to implement a cleaning process after the trimming process and before the epitaxial growth process.

19. The semiconductor processing system of claim 15, wherein the instructions that, when executed by the processor, cause the computer system to further perform the operations of:

controlling a cleaning process in a third processing chamber of the processing system, the cleaning process cleaning the alternating layers of the first material and the second material; and controlling a transfer of the substrate from the third processing chamber to the first processing chamber through the transfer apparatus, the third processing chamber being coupled to the transfer apparatus.

20. The semiconductor processing system of claim 15, wherein:

the transfer apparatus comprises a first transfer chamber coupled to the first processing chamber and the second processing chamber;

the transfer of the substrate from the first processing chamber to the second processing chamber causes the substrate to pass through the first transfer chamber; and the computer system is configured to maintain a pressure in the first transfer chamber less than or equal to 300 Torr during the transfer of the substrate from the first processing chamber to the second processing chamber.

* * * * *